United States Patent
Guyette et al.

(10) Patent No.: US 11,929,733 B2
(45) Date of Patent: Mar. 12, 2024

(54) TRANSVERSELY-EXCITED FILM BULK ACOUSTIC RESONATOR MATRIX FILTERS WITH INPUT AND OUTPUT IMPEDANCES MATCHED TO RADIO FREQUENCY FRONT END ELEMENTS

(71) Applicant: Murata Manufacturing Co., Ltd., Nagaokakyo (JP)

(72) Inventors: Andrew Guyette, San Mateo, CA (US); Neal Fenzi, Santa Barbara, CA (US); Michael Eddy, Santa Barbara, CA (US); Bryant Garcia, Belmont, CA (US)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 199 days.

(21) Appl. No.: 17/494,677

(22) Filed: Oct. 5, 2021

(65) Prior Publication Data
US 2022/0109423 A1 Apr. 7, 2022

Related U.S. Application Data

(63) Continuation-in-part of application No. 17/373,427, filed on Jul. 12, 2021, now Pat. No. 11,476,834, (Continued)

(51) Int. Cl.
*H03H 9/205* (2006.01)
*H03H 9/54* (2006.01)
*H04B 1/00* (2006.01)

(52) U.S. Cl.
CPC ............. *H03H 9/205* (2013.01); *H03H 9/54* (2013.01); *H04B 1/0057* (2013.01)

(58) Field of Classification Search
CPC ...... H03H 9/205; H03H 9/54; H03H 9/02228; H03H 9/174; H03H 9/542; H03H 9/564; H03H 9/568; H03H 9/706; H04B 1/0057
See application file for complete search history.

(56) References Cited

U.S. PATENT DOCUMENTS

| 5,281,934 A | 1/1994 | Shiau et al. |
| 5,446,330 A | 8/1995 | Eda et al. |

(Continued)

FOREIGN PATENT DOCUMENTS

| CN | 209017001 U | * 6/2019 |
| CN | 209608623 U | 11/2019 |

(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8 Sep. 6, 2017.

(Continued)

*Primary Examiner* — Andrea Lindgren Baltzell
*Assistant Examiner* — Kimberly E Glenn
(74) *Attorney, Agent, or Firm* — ARENTFOX SCHIFF LLP

(57) ABSTRACT

There are disclosed matrix filters having an antenna port, receive ports and transmit ports. A receive matrix filter is coupled between each receive port and the antenna port; an a transmit matrix filter is coupled between the antenna port and each transmit port. An impedance at the receive port is matched to an input impedance of a low noise amplifier (LNA), an impedance at the transmit port is match to an output impedance of a power amplifier (PA), and an impedance at the antenna port is match an impedance of an antenna.

22 Claims, 16 Drawing Sheets

Related U.S. Application Data which is a continuation-in-part of application No. 17/372,114, filed on Jul. 9, 2021, which is a continuation-in-part of application No. 17/122,986, filed on Dec. 15, 2020, now Pat. No. 11,309,865, which is a continuation of application No. 17/121,724, filed on Dec. 14, 2020, now Pat. No. 11,405,017.

(60) Provisional application No. 63/185,454, filed on May 7, 2021, provisional application No. 63/180,084, filed on Apr. 27, 2021, provisional application No. 63/087,789, filed on Oct. 5, 2020.

(56) References Cited

U.S. PATENT DOCUMENTS

| | | | |
|---|---|---|---|
| 5,552,655 A | 9/1996 | Stokes et al. | |
| 5,654,680 A * | 8/1997 | Kwan | H03H 9/6406 310/313 C |
| 5,726,610 A | 3/1998 | Allen et al. | |
| 5,853,601 A | 12/1998 | Krishaswamy | |
| 5,952,899 A | 9/1999 | Kadota et al. | |
| 6,377,140 B1 | 4/2002 | Ehara et al. | |
| 6,452,909 B1 | 9/2002 | Bauer | |
| 6,516,503 B1 | 2/2003 | Ikada et al. | |
| 6,540,827 B1 | 4/2003 | Levy et al. | |
| 6,707,229 B1 | 3/2004 | Martin | |
| 6,710,514 B2 | 3/2004 | Ikada et al. | |
| 6,724,278 B1 | 4/2004 | Smith | |
| 7,345,400 B2 | 3/2008 | Nakao et al. | |
| 7,463,118 B2 | 12/2008 | Jacobsen | |
| 7,535,152 B2 | 5/2009 | Ogami | |
| 7,684,109 B2 | 3/2010 | Godshalk et al. | |
| 7,728,483 B2 | 6/2010 | Tanaka | |
| 7,868,519 B2 | 1/2011 | Umeda | |
| 7,941,103 B2 | 5/2011 | Iwamoto | |
| 7,965,015 B2 | 6/2011 | Tai et al. | |
| 8,278,802 B1 | 10/2012 | Lee et al. | |
| 8,294,330 B1 | 10/2012 | Abbott et al. | |
| 8,344,815 B2 | 1/2013 | Yamanaka | |
| 8,816,567 B2 | 8/2014 | Zuo et al. | |
| 8,829,766 B2 | 9/2014 | Milyutin et al. | |
| 8,932,686 B2 | 1/2015 | Hayakawa et al. | |
| 9,093,979 B2 | 7/2015 | Wang | |
| 9,112,134 B2 | 8/2015 | Takahashi | |
| 9,130,145 B2 | 9/2015 | Martin et al. | |
| 9,219,466 B2 | 12/2015 | Meltaus et al. | |
| 9,276,557 B1 | 3/2016 | Nordquist et al. | |
| 9,369,105 B1 | 6/2016 | Li et al. | |
| 9,391,650 B2 * | 7/2016 | Aparin | H04B 1/0458 |
| 9,425,765 B2 | 8/2016 | Rinaldi | |
| 9,525,398 B1 | 12/2016 | Olsson | |
| 9,640,750 B2 | 5/2017 | Nakanishi et al. | |
| 9,748,923 B2 | 8/2017 | Kando et al. | |
| 9,762,202 B2 | 9/2017 | Thalmayr et al. | |
| 9,780,759 B2 | 10/2017 | Kimura et al. | |
| 9,837,984 B2 | 12/2017 | Khlat et al. | |
| 10,079,414 B2 | 9/2018 | Guyette | |
| 10,187,039 B2 | 1/2019 | Komatsu et al. | |
| 10,200,013 B2 | 2/2019 | Bower | |
| 10,211,806 B2 | 2/2019 | Bhattacharjee | |
| 10,284,176 B1 | 5/2019 | Solal | |
| 10,491,192 B1 | 11/2019 | Plesski et al. | |
| 10,601,392 B2 | 3/2020 | Plesski | |
| 10,637,438 B2 | 4/2020 | Garcia | |
| 10,644,674 B2 | 5/2020 | Takamine | |
| 10,756,697 B2 | 8/2020 | Plesski | |
| 10,790,802 B2 | 9/2020 | Yantchev | |
| 10,797,675 B2 | 10/2020 | Plesski | |
| 10,819,309 B1 | 10/2020 | Turner | |
| 10,826,462 B2 | 11/2020 | Plesski | |
| 10,868,510 B2 | 12/2020 | Yantchev et al. | |
| 10,868,512 B2 | 12/2020 | Garcia | |
| 10,868,513 B2 | 12/2020 | Yantchev | |
| 10,911,017 B2 | 2/2021 | Plesski | |
| 10,911,021 B2 | 2/2021 | Turner | |
| 10,911,023 B2 | 2/2021 | Turner | |
| 10,917,070 B2 | 2/2021 | Plesski | |
| 10,917,072 B2 | 2/2021 | McHugh et al. | |
| 10,985,726 B2 | 4/2021 | Plesski | |
| 10,985,728 B2 | 4/2021 | Plesski et al. | |
| 10,985,730 B2 | 4/2021 | Garcia | |
| 10,992,282 B1 | 4/2021 | Plesski et al. | |
| 10,992,283 B2 | 4/2021 | Plesski et al. | |
| 10,992,284 B2 | 4/2021 | Yantchev | |
| 10,998,877 B2 | 5/2021 | Turner et al. | |
| 10,998,882 B2 | 5/2021 | Yantchev et al. | |
| 11,003,971 B2 | 5/2021 | Plesski et al. | |
| 11,405,017 B2 | 8/2022 | Guyette et al. | |
| 11,476,834 B2 | 10/2022 | Guyette et al. | |
| 2002/0079986 A1 | 6/2002 | Ruby et al. | |
| 2002/0158714 A1 | 10/2002 | Kaitila et al. | |
| 2002/0189062 A1 | 12/2002 | Lin et al. | |
| 2003/0080831 A1 | 5/2003 | Naumenko et al. | |
| 2003/0199105 A1 | 10/2003 | Kub et al. | |
| 2004/0100164 A1 | 5/2004 | Murata | |
| 2004/0261250 A1 | 12/2004 | Kadota et al. | |
| 2005/0185026 A1 | 8/2005 | Noguchi et al. | |
| 2005/0218488 A1 | 10/2005 | Matsuo | |
| 2005/0264136 A1 | 12/2005 | Tsutsumi et al. | |
| 2006/0055485 A1 | 3/2006 | Lobeek | |
| 2006/0179642 A1 | 8/2006 | Kawamura | |
| 2007/0182510 A1 | 8/2007 | Park | |
| 2007/0188047 A1 | 8/2007 | Tanaka | |
| 2007/0194863 A1 | 8/2007 | Shibata et al. | |
| 2007/0267942 A1 | 11/2007 | Matsumoto et al. | |
| 2008/0246559 A1 | 10/2008 | Ayazi | |
| 2008/0309430 A1 | 12/2008 | Tsuzuki et al. | |
| 2010/0064492 A1 | 3/2010 | Tanaka | |
| 2010/0123367 A1 | 5/2010 | Tai et al. | |
| 2011/0018389 A1 | 1/2011 | Fukano et al. | |
| 2011/0018654 A1 | 1/2011 | Bradley et al. | |
| 2011/0109196 A1 | 5/2011 | Goto et al. | |
| 2011/0278993 A1 | 11/2011 | Iwamoto | |
| 2012/0286900 A1 | 11/2012 | Kadota et al. | |
| 2013/0234805 A1 | 9/2013 | Takahashi | |
| 2013/0271238 A1 | 10/2013 | Onda | |
| 2013/0278609 A1 | 10/2013 | Stephanou et al. | |
| 2013/0321100 A1 | 12/2013 | Wang | |
| 2014/0130319 A1 | 5/2014 | Iwamoto | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2014/0340173 A1 | 11/2014 | Burgener et al. | |
| 2015/0042417 A1 | 2/2015 | Onodera et al. | |
| 2015/0165479 A1 | 6/2015 | Lasiter et al. | |
| 2015/0319537 A1 | 11/2015 | Perois et al. | |
| 2015/0333730 A1 | 11/2015 | Meltaus et al. | |
| 2016/0028367 A1 | 1/2016 | Shealy | |
| 2016/0182008 A1 | 6/2016 | Bhattacharjee | |
| 2016/0182009 A1 | 6/2016 | Bhattacharjee | |
| 2017/0063332 A1 | 3/2017 | Gilbert et al. | |
| 2017/0070405 A1 | 3/2017 | Hashemi et al. | |
| 2017/0179225 A1 | 6/2017 | Kishimoto | |
| 2017/0179928 A1 | 6/2017 | Raihn et al. | |
| 2017/0214381 A1 | 7/2017 | Bhattacharjee | |
| 2017/0214387 A1 | 7/2017 | Burak et al. | |
| 2017/0222617 A1 | 8/2017 | Mizoguchi | |
| 2017/0222622 A1 | 8/2017 | Solal et al. | |
| 2017/0370791 A1 | 12/2017 | Nakamura et al. | |
| 2018/0005950 A1 | 1/2018 | Watanabe | |
| 2018/0026603 A1 | 1/2018 | Iwamoto | |
| 2018/0033952 A1 | 2/2018 | Yamamoto | |
| 2018/0041191 A1 | 2/2018 | Park | |
| 2018/0062615 A1 | 3/2018 | Kato et al. | |
| 2018/0062617 A1 | 3/2018 | Yun et al. | |
| 2018/0123016 A1 | 5/2018 | Gong | |
| 2018/0191322 A1 | 7/2018 | Chang et al. | |
| 2018/0278227 A1 | 9/2018 | Hurwitz | |
| 2019/0068164 A1 | 2/2019 | Houlden et al. | |
| 2019/0123721 A1 | 4/2019 | Takamine | |
| 2019/0131953 A1 | 5/2019 | Gong | |

(56) References Cited

U.S. PATENT DOCUMENTS

| | | |
|---|---|---|
| 2019/0245518 A1 | 8/2019 | Ito |
| 2019/0273480 A1 | 9/2019 | Lin et al. |
| 2019/0348966 A1 | 11/2019 | Campanella-Pineda |
| 2019/0386636 A1 | 12/2019 | Plesski et al. |
| 2020/0036357 A1 | 1/2020 | Mimura |
| 2020/0235719 A1 | 7/2020 | Yantchev et al. |
| 2020/0350891 A1 | 11/2020 | Turner |
| 2021/0013859 A1 | 1/2021 | Turner et al. |
| 2021/0399750 A1 | 12/2021 | Varela Campelo |

FOREIGN PATENT DOCUMENTS

| | | |
|---|---|---|
| CN | 113839643 A * | 12/2021 |
| WO | 2016017104 | 2/2016 |
| WO | 2018003273 | 1/2018 |
| WO | 2018079522 A1 | 5/2018 |
| WO | 2019241174 A1 | 12/2019 |

OTHER PUBLICATIONS

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages. Jun. 5, 2018.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945 Jan. 22, 2017.

USPTO/ISA, International Search Report and Written Opinion for PCT Application No. PCT/US2019/036433 dated Aug. 29, 2019. dated Aug. 29, 2019.

Buchanan "Ceramic Materials for Electronics" 3rd Edition, first published in 2004 by Marcel Dekker, Inc. pp. 496 (Year 2004). Jan. 2004.

Sorokin et al.Study of Microwave Acoustic Attenuation in a Multifrequency Bulk Acoustic Resonator Based on a Synthetic Diamond Single CrystalPublished in Acoustical Physics, vol. 61, No. 6, 2015 pp. 675 (Year 2015) Jan. 2015.

Zou, Jie "High-Performance Aluminum Nitride Lamb Wave Resonators for RF Front-End Technology" University of California, Berkeley, Summer 2015, pp. 63 (Year 2015) Jan. 2015.

International Search Report and Written Opinion for PCT Application No. PCT/US2019/058632 dated Jan. 17, 2020. dated Jan. 17, 2020.

G. Manohar, Investigation of Various Surface Acoustic Wave Design Configurations for Improved Sensitivity, Jan. 2012, Doctoral dissertation, University of South Florida, USA Jan. 2012.

Ekeom, D. & Dubus, Bertrand & Volatier, A., Solidly mounted resonator (SMR) FEM-BEM simulation, 2006, 1474-1477, 10.1109/ULTSYM.2006.371. 2006.

Santosh, G. , Surface acoustic wave devices on silicon using patterned and thin film ZnO, Ph.D. thesis, Feb. 2016, Indian Institute of technology Guwahati, Assam, India Feb. 2016.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

USPTO/ISA, International Search Report and Written Opinion for PCT Application No. PCT/US2020/45654 dated Oct. 29, 2020. 2020.

Safari et al. "Piezoelectric for Transducer Applications" published by Elsevier Science Ltd., p. 4 (Year: 2000). 2020.

Moussa et al. Review on Triggered Liposomal Drug Delivery with a Focus on Ultrasound 2015, Bentham Science Publishers, pp. 16 (Year 2005) 2005.

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Material Properties of Tibtech Innovations, @ 2018 TIBTECH Innovations (Year 2018). 2018.

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190. 2014.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2. 2018.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406 1986.

Naumenko et al., "Optimal orientations of Lithium Niobate for resonator SAW filters", 2003 IEEE Ultrasonics SYMPOSIUM-pp. 2110-2113. (Year: 2003) 2003.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Rodriguez-Madrid et al., "Super-High-Frequency SAW Resonators on AIN/Diamond", IEEE Electron Device Letters, vol. 33, No. 4, Apr. 2012, pp. 495-497. Year: 2012) 2012.

Webster Dictionary, Meaning of "diaphragm" Merriam Webster since 1828. 1828.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

* cited by examiner

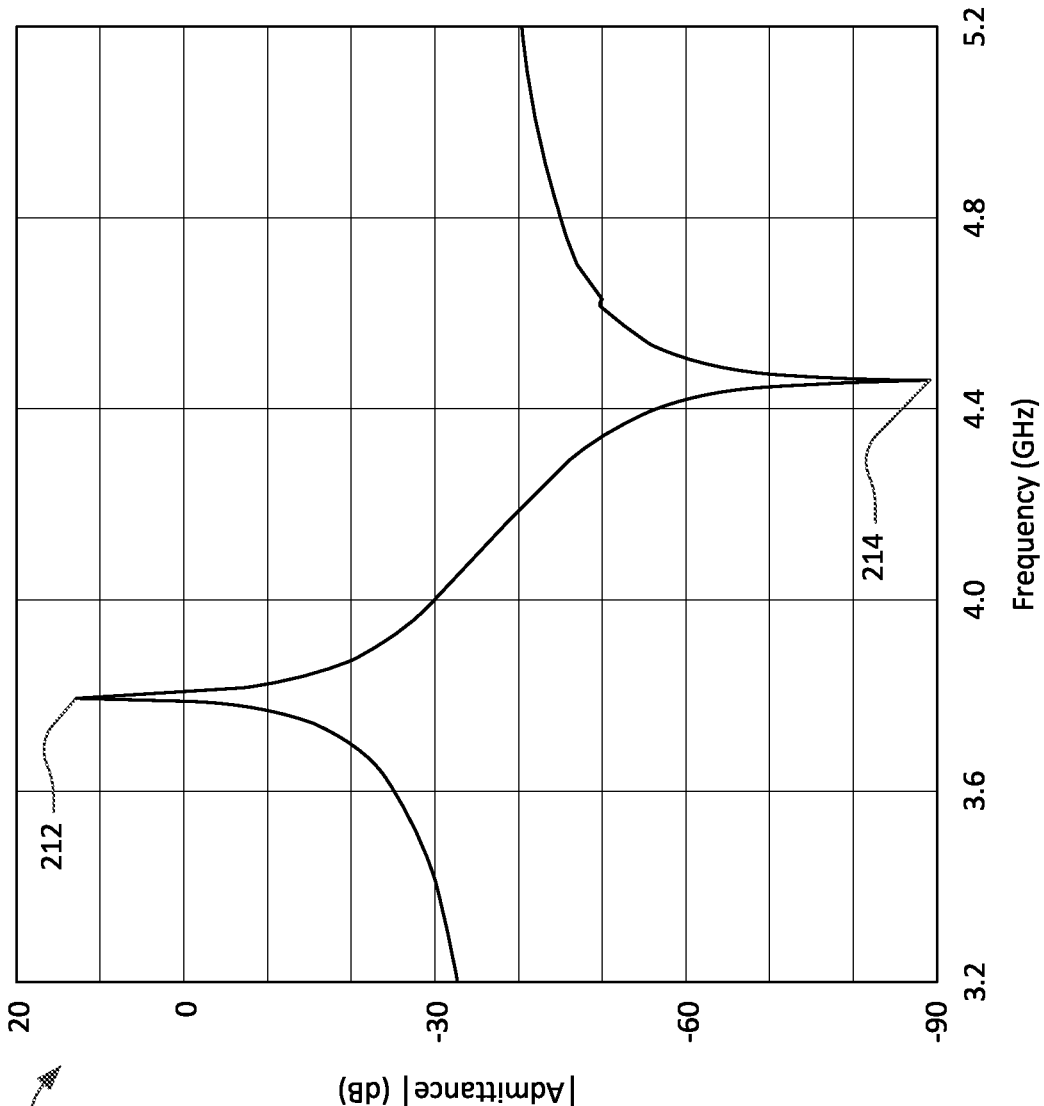
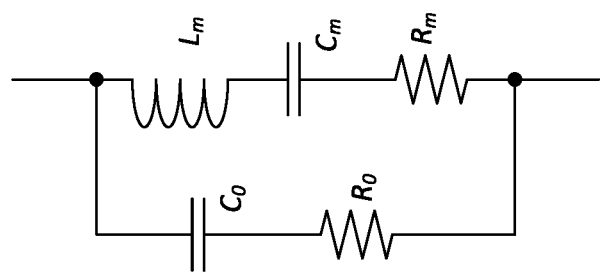
FIG. 2A
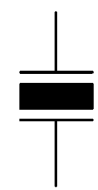
FIG. 2C
FIG. 2B

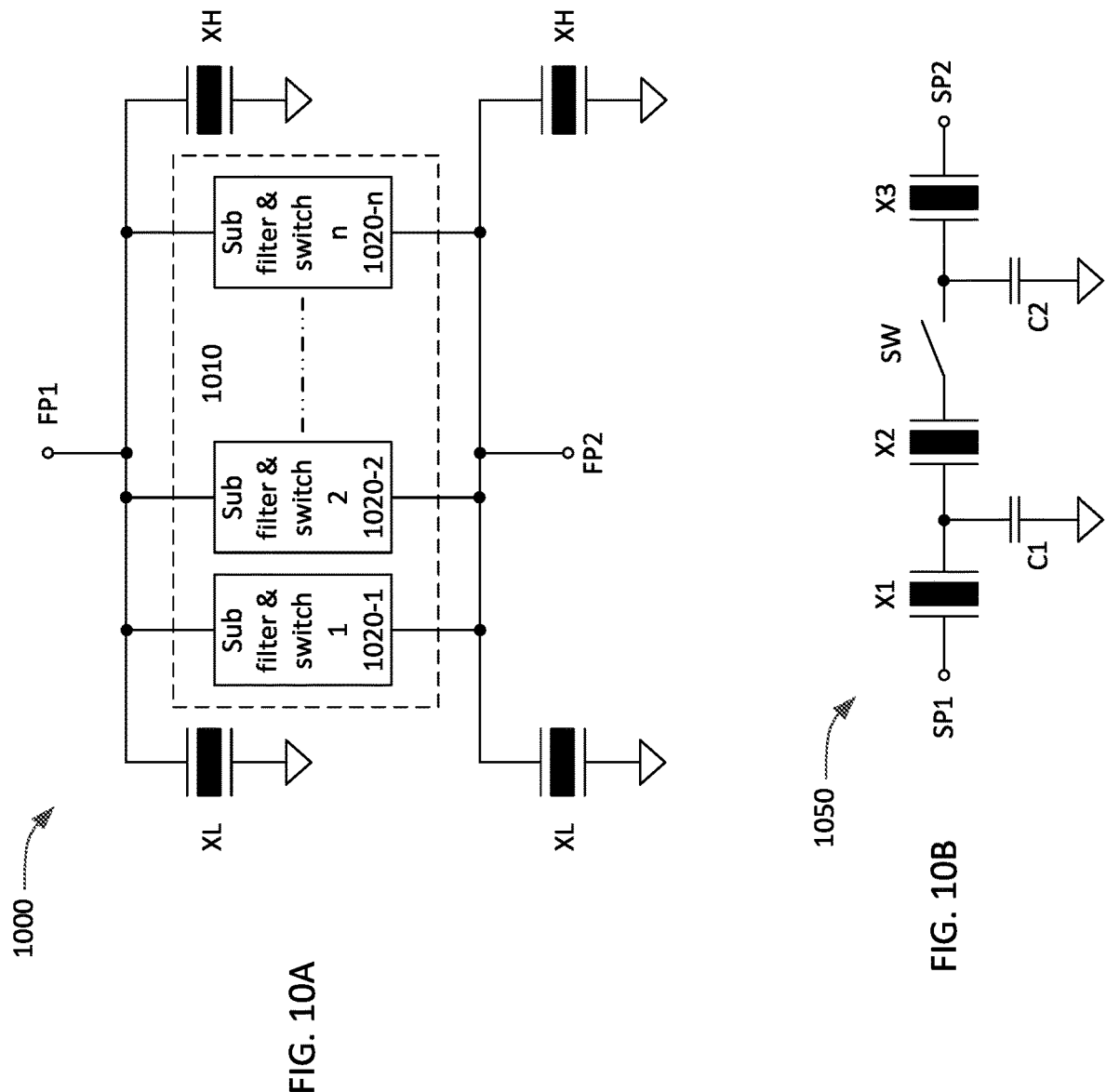

| | Fr (MHZ) | C0 (pF) |
|---|---|---|
| X1A | 1942 | 0.07 |
| X2A | 1919 | 0.06 |
| X3A | 1920 | 0.04 |
| X1B | 1989 | 0.09 |
| X2B | 1960 | 0.08 |
| X3B | 2003 | 0.02 |
| X1C | 2058 | 0.10 |
| X2C | 2014 | 0.09 |
| X3C | 2072 | 0.02 |
| XL1 | 1910 | 0.20 |
| XH1 | 2143 | 0.06 |
| XL2 | 1910 | 0.03 |
| XH2 | 2143 | 0.02 |
| | | C(pF) |
| C1A | | 1.14 |
| C2A | | 0.76 |
| C1B | | 1.10 |
| C2B | | 0.57 |
| C1C | | 1.25 |
| C2C | | 0.61 |

FIG. 15C

| | Fr (MHZ) | C0 (pF) |
|---|---|---|
| X1A | 1948 | 0.07 |
| X2A | 1950 | 0.08 |
| X3A | 1903 | 0.76 |
| X1B | 2002 | 0.10 |
| X2B | 1997 | 0.12 |
| X3B | 1912 | 2.15 |
| X1C | 2074 | 0.07 |
| X2C | 2067 | 0.06 |
| X3C | 2009 | 1.15 |
| XL1 | 1899 | 0.28 |
| XH1 | 2138 | 0.07 |
| XL2 | 1905 | 0.66 |
| XH2 | 2151 | 2.00 |
| | | C(pF) |
| C1A | | 1.38 |
| C2A | | 3.92 |
| C1B | | 1.45 |
| C2B | | 4.42 |
| C1C | | 1.41 |
| C2C | | 4.15 |

FIG. 15B

TRANSVERSELY-EXCITED FILM BULK ACOUSTIC RESONATOR MATRIX FILTERS WITH INPUT AND OUTPUT IMPEDANCES MATCHED TO RADIO FREQUENCY FRONT END ELEMENTS

RELATED APPLICATION INFORMATION

This patent claims priority from provisional patent application 63/185,454, filed May 7, 2021, entitled MATRIX FILTER WITH RFFE MATCHING.

This patent is a continuation-in-part of application Ser. No. 17/373,427, filed Jul 12, 2021, titled TRANSVERSELY-EXCITED FILM BULK ACOUSTIC RESONATOR MATRIX FILTERS WITH SWITCHES IN PARALLEL WITH SUB-FILTER SHUNT CAPACITORS which is a continuation-in-part of application Ser. No. 17/372,114, filed Jul. 9, 2021, titled TRANSVERSELY-EXCITED FILM BULK ACOUSTIC RESONATOR MATRIX FILTERS WITH NONCONTIGUOUS PASS-BAND, which claims priority from provisional patent application 63/180,084, filed Apr. 27, 2021, entitled MATRIX FILTER FOR RF DIVERSITY RECEIVER and which is also a continuation-in-part of application Ser. No. 17/122,986, filed Dec. 15, 2020, titled ACOUSTIC MATRIX DIPLEXERS AND RADIOS USING ACOUSTIC MATRIX DIPLEXERS, which is a continuation of application Ser. No. 17/121,724, filed Dec, 14, 2020, titled ACOUSTIC MATRIX FILTERS AND RADIOS USING ACOUSTIC MATRIX FILTERS, which claims priority from provisional patent application 63/087,789, filed Oct. 5, 2020, entitled MATRIX XBAR FILTER.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are N77, which uses the frequency range from 3300 MHz to 4200 MHz, and N79, which uses the frequency range from 4400 MHz to 5000 MHz. Both band N77 and band N79 use time-division duplexing (TDD), such that a communications device operating in band N77 and/or band N79 use the same frequencies for both uplink and downlink transmissions. Bandpass filters for bands N77 and N79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XB AR) is an acoustic resonator structure for use in microwave filters. The XBAR is described in patent U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz. Matrix XBAR filters are also suited for frequencies between 1 GHz and 3 GHz.

DESCRIPTION OF THE DRAWINGS

FIG. 2A is an equivalent circuit model of an acoustic resonator.

FIG. 2B is a graph of the admittance of an ideal acoustic resonator.

FIG. 2C is a circuit symbol for an acoustic resonator.

FIG. 10A is a schematic diagram of a reconfigurable switched matrix filter using acoustic resonators with input and output impedances matching to radio frequency front-end (RFFE) elements.

FIG. 10B is a schematic diagram of a type of sub-filter and switch module of FIG. 10A.

FIG. 15B shows specific component characteristics for a first example of FIG. 15A.

FIG. 15C shows specific component characteristics for a second example of FIG. 15A.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

The Transversely-Excited Film Bulk Acoustic Resonator (XBAR) is a new resonator structure for use in acoustic filters for filtering microwave signals. The XBAR is described in patent U.S. Pat. No. 10,491,291, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A matrix filter is a filter architecture that allows a variety of low frequency filters to be implemented with small XBAR resonators. Sub-filters of the matrix filter can provide low frequency noncontiguous bandpass filtering. Such a bandpass sub-filter has a ladder filter circuit with XBAR series elements and capacitor shunt elements. The following describes improved XBAR resonators, filters and fabrication techniques that set the input and/or output impedances of a matrix filter over a wide range to provide impedance matching to radio frequency front-end (RFFE) elements such as antenna (Ant), power amplifiers (PAs) and low noise amplifiers (LNs). Because the matrix filter has impedance matching the RFFEs, there is no need for external impedance matching or switching.

Figure 1:
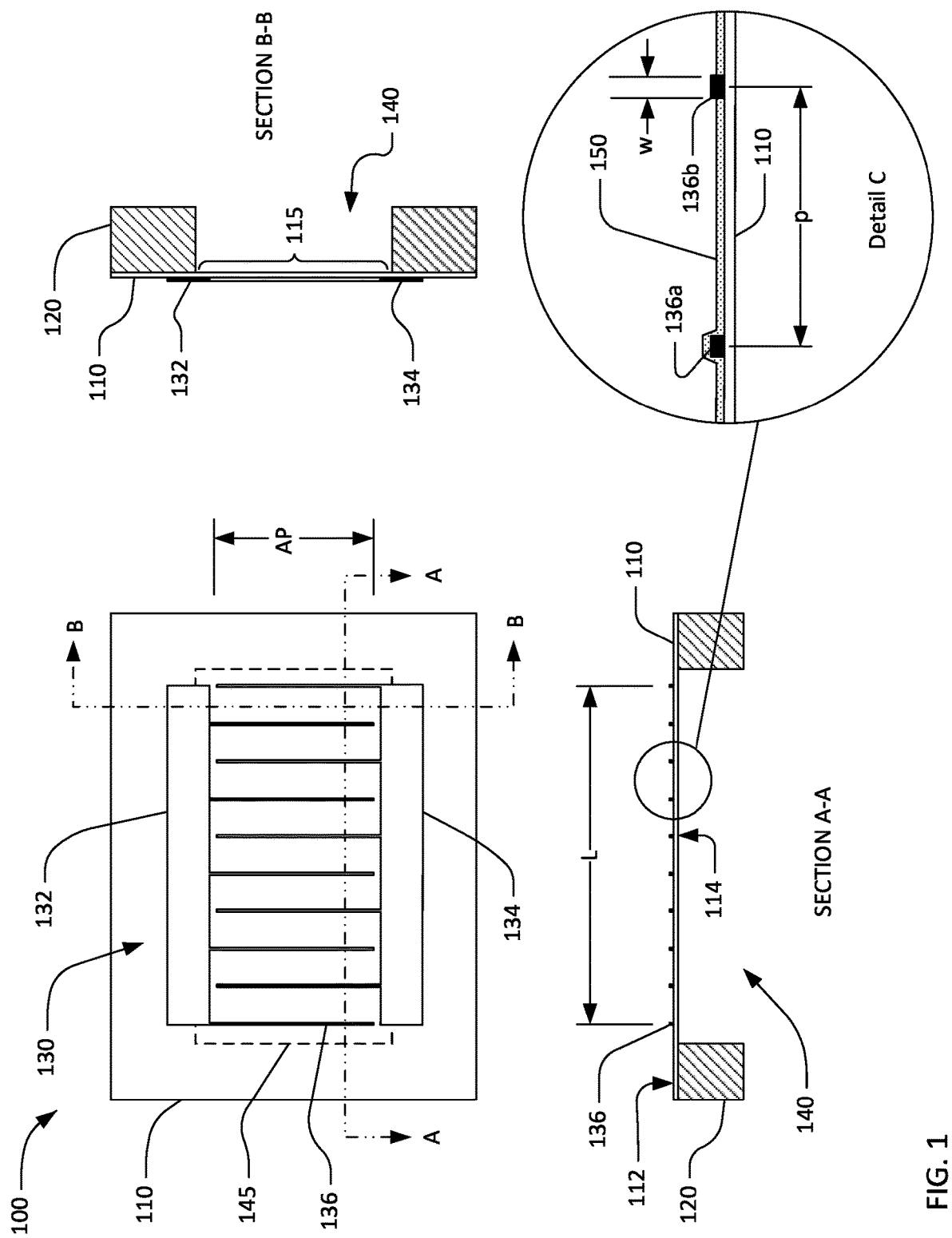
FIG. 1 includes a schematic plan view, two schematic cross-sectional views, and a detailed cross-sectional view of a transversely-excited film bulk acoustic resonator (XBAR).

FIG. 1 shows a simplified schematic top view, orthogonal cross-sectional views, and a detailed cross-sectional view of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz. The matrix XBAR filters described in this patent are also suited for frequencies above 1 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut (which is to say the Z axis is normal to the front and back surfaces 112, 114), rotated Z-cut, or rotated YX cut. XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode of an XBAR is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

The detailed cross-section view (Detail C) shows two IDT fingers 136a, 136b on the surface of the piezoelectric plate 110. The dimension p is the "pitch" of the IDT and the dimension w is the width or "mark" of the IDT fingers. A dielectric layer 150 may be formed between and optionally over (see IDT finger 136a) the IDT fingers. The dielectric layer 150 may be a non-piezoelectric dielectric material, such as silicon dioxide or silicon nitride. The dielectric layer 150 may be formed of multiple layers of two or more materials. The IDT fingers 136a and 136b may be aluminum, copper, beryllium, gold, tungsten, molybdenum, alloys and combinations thereof, or some other conductive material. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars of the IDT 130 may be made of the same or different materials as the fingers.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds of parallel fingers in the IDT 110. Similarly, the thickness of the fingers in the cross-sectional views is greatly exaggerated.

An XBAR based on shear acoustic wave resonances can achieve better performance than current state-of-the art surface acoustic wave (SAW), film-bulk-acoustic-resonators (FBAR), and solidly-mounted-resonator bulk-acoustic-wave (SMR BAW) devices. In particular, the piezoelectric coupling for shear wave XBAR resonances can be high (>20%) compared to other acoustic resonators. High piezoelectric coupling enables the design and implementation of microwave and millimeter-wave filters of various types with appreciable bandwidth.

The basic behavior of acoustic resonators, including XBARs, is commonly described using the Butterworth Van Dyke (BVD) circuit model as shown in FIG. 2A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. While the BVD model does not fully describe the behavior of an acoustic resonator, it does a good job of modeling the two primary resonances that are used to design band-pass filters, duplexers, and multiplexers (multiplexers are filters with more than 2 input or output ports with multiple passbands).

The first primary resonance of the BVD model is the motional resonance caused by the series combination of the motional inductance $L_m$ and the motional capacitance $C_m$. The second primary resonance of the BVD model is the anti-resonance caused by the combination of the motional inductance $L_m$, the motional capacitance $C_m$, and the static capacitance $C_0$. In a lossless resonator ($R_m=R_0=0$), the frequency $F_r$ of the motional resonance is given by $$F_r = \frac{1}{2\pi\sqrt{L_m C_m}} \tag{1}$$

The frequency $F_a$ of the anti-resonance is given by $$F_a = F_r \sqrt{1 + \frac{1}{\gamma}} \quad (2)$$

where $\gamma = C_0/C_m$ is dependent on the resonator structure and the type and the orientation of the crystalline axes of the piezoelectric material.

FIG. 2B is a graph 200 of the magnitude of admittance of a theoretical lossless acoustic resonator. The acoustic resonator has a resonance 212 at a resonance frequency where the admittance of the resonator approaches infinity. The resonance is due to the series combination of the motional inductance $L_m$ and the motional capacitance $C_m$ in the BVD model of FIG. 2A. The acoustic resonator also exhibits an anti-resonance 214 where the admittance of the resonator approaches zero. The anti-resonance is caused by the combination of the motional inductance $L_m$, the motional capacitance $C_m$, and the static capacitance $C_0$. In a lossless resonator ($R_m = R_0 = 0$), the frequency $F_r$ of the resonance is given by $$F_r = \frac{1}{2\pi \sqrt{L_m C_m}} \quad (1)$$

The frequency $F_a$ of the anti-resonance is given by $$F_a = F_r \sqrt{1 + \frac{1}{\gamma}} \quad (2)$$

In over-simplified terms, the lossless acoustic resonator can be considered a short circuit at the resonance frequency 212 and an open circuit at the anti-resonance frequency 214. The resonance and anti-resonance frequencies in FIG. 2B are representative, and an acoustic resonator may be designed for other frequencies.

FIG. 2C shows the circuit symbol for an acoustic resonator such as an XBAR. This symbol will be used to designate each acoustic resonator in schematic diagrams of filters in subsequent figures.

Figure 3A:
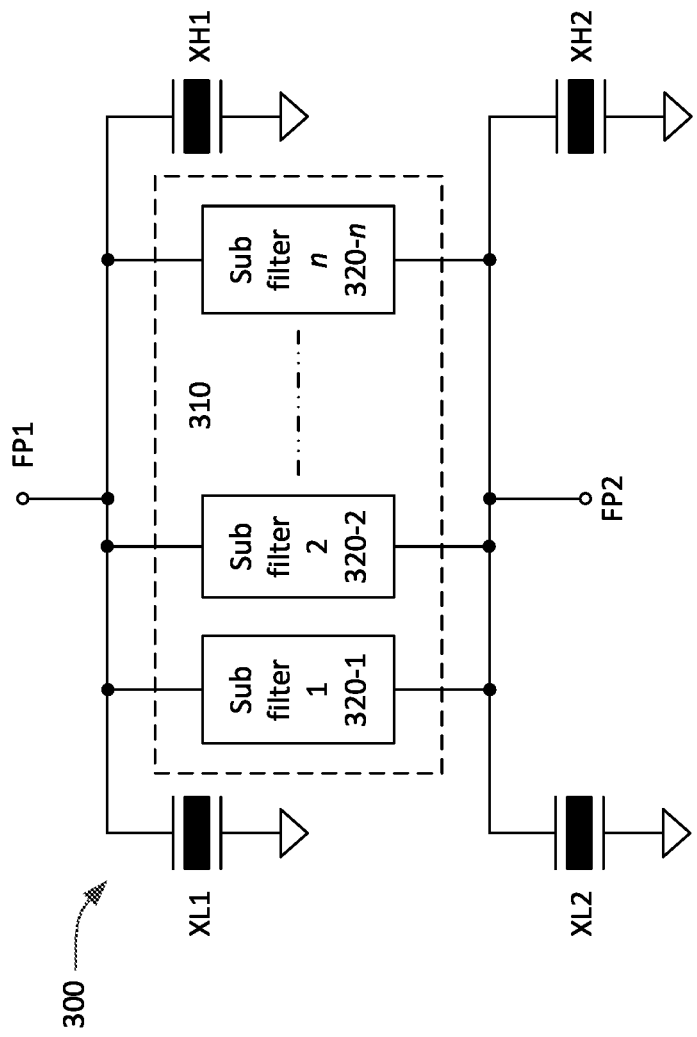
FIG. 3A is a schematic diagram of a matrix filter using acoustic resonators with input and output impedances matching to radio frequency front-end (RFFE) elements.

FIG. 3A is a schematic diagram of a matrix filter 300 using acoustic resonators with input and output impedances matching to radio frequency front-end (RFFE) elements. The matrix filter 300 includes an array 310 of n sub-filters 320-1, 320-2, 320-n connected in parallel between a first filter port (FP1) and a second filter port (FP2), where n is an integer greater than one. The sub-filters 320-1, 320-2, 320-n have noncontiguous passbands such that the bandwidth of the matrix filter 300 is not equal to the sum of the bandwidths of the constituent sub-filters, but instead has three separate and independent passbands separated by stop bands that exist where the input-output transfer function of the matrix filter 300 is less than −20 dB. In the subsequent examples in this patent n=3. n can be less than or greater than 3 as necessary to provide the desired noncontiguous passbands for the matrix filter 300. In some cases, the n sub-filters 320-1, 320-2, 320-n may include one or more XBARs. The filter 300 and/or sub-filters may be RF filters that pass frequency bands defined by the 5G NR standard.

The array 310 of sub-filters is terminated at the FP1 end by acoustic resonators XL1 and XH1, which are preferably but not necessarily XBARs. The array 310 of sub-filters is terminated at the FP2 end by acoustic resonators XL2 and XH2, which are preferably but not necessarily XBARs. The acoustic resonators XL1, XL2, XH1, and XH2 create "transmission zeros" at their respective resonance frequencies. A "transmission zero" is a frequency where the input-output transfer function of the filter 300 is very low (and would be zero if the acoustic resonators XL1, XL2, XH1, and XH2 were lossless). The zero transmission may be caused by one or more of the acoustic resonators creating a very low impedance to ground and thus, in this configuration cause the sub-filters to be removed as filtering components as the acoustic resonators are basically short circuits to ground so that the sub-filters have no effect on the filter 300 during transmission zero frequencies. Typically, but not necessarily, the resonance frequencies of XL1 and XL2 are equal, and the resonance frequencies of XH1 and XH2 are equal. The resonant frequencies of the acoustic resonators XL1, XL2 are selected to provide transmission zeros adjacent to the lower edge of the filter passband. XL1 and XL2 may be referred to as "low-edge resonators" since their resonant frequencies are proximate the lower edge of the filter passband. The acoustic resonators XL1 and XL2 also act as shunt inductances to help match the impedance at the ports of the filter to a desired impedance value. In the subsequent examples in this patent, the impedance at each port of the filters may be matched to 50 ohms when connected to an RF antenna; 4 ohms when connected to a power amplifier such as of an RF transmitter; and 300 ohms when connected to a low noise amplifier such as of an RF receiver. Specific examples of these embodiments are given at FIGS. 15A-C. In other cases, the impedance may be another value if desired, such as 20, 100 or 1000 ohms. The resonant frequencies of acoustic resonators XH1, XH2 are selected to provide transmission zeros at or above the higher edge of the filter passband. XH1 and XH2 may be referred to as "high-edge resonators" since their resonant frequencies are proximate the higher edge of the filter passband. High-edge resonators XH1 and XH2 may not be required in all matrix filters, such as filters that have sub-filters that will not pass a relative amplitude of signals at these high edge frequencies.

Figure 3B:
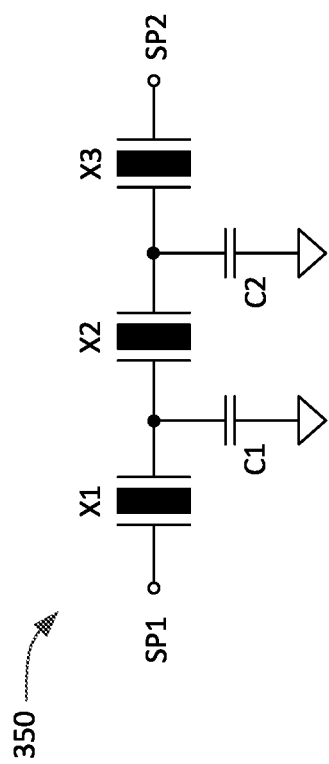
FIG. 3B is a schematic diagram of a sub-filter of FIG. 3A.

FIG. 3B is a schematic diagram of a sub-filter 350 suitable for each of sub-filters 320-1, 320-2, and 320-n of filter 300. The sub-filter 350 includes three acoustic resonators XA, XB, XC connected in series between a first sub-filter port (SP1) which can be connected to FP1 and a second sub-filter port (SP2) which can be connected to FP2. The acoustic resonators XA, XB, XC are preferably but not necessarily XBARs. The sub-filter 350 includes two coupling capacitors CA, CB, each of which is connected between ground and a respective node between two of the acoustic resonators. The inclusion of three acoustic resonators in the sub-filter 350 is exemplary. A sub-filter may have m acoustic resonators, where m is an integer greater than one. A sub-filter with m acoustic resonators includes m−1 coupling capacitors. The m acoustic resonators of a sub-filter are connected in series between the two ports SP1 and SP2 of a sub-filter and each of the m−1 coupling capacitors is connected between ground and a node between a respective pair of acoustic resonators from the m acoustic resonators.

Compared to other types of acoustic resonators, XBARs have very high electromechanical coupling (which results in a large difference between the resonance and anti-resonance frequencies), but low capacitance per unit area. The matrix filter architecture, as shown in FIG. 3A and FIG. 3B, takes advantage of the high electromechanical coupling of XBARs without requiring high resonator capacitance.

Figure 4:
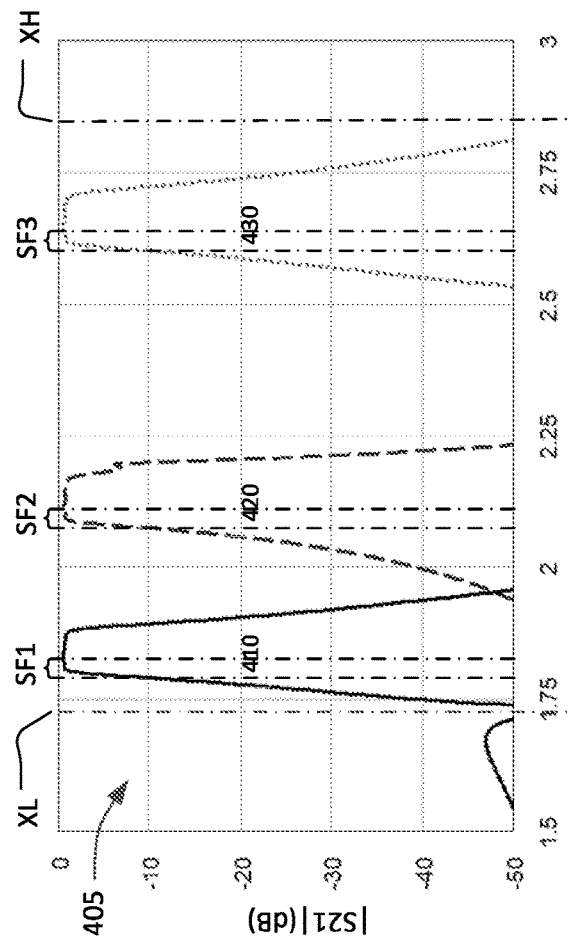
FIG. 4 is a graph of the performance of an embodiment of the filter of FIG. 3A showing resonant frequencies of the sub-filters.

FIG. 4 is a graph 400 of the performance 405 of an exemplary embodiment of a matrix filter implemented using XBARs for all of the acoustic resonators. The performance 405 in graph 400 may be performance of the transfer function S21 for filter 300 having 3 non-continuous passband sub-filters 1, 2 and 3. Specifically, performance 405 includes the solid, dashed and dotted lines 410, 420 and 430 that are a plot of S21, the FP1 to FP2 transfer function, of the filter as a function of frequency where each of lines 410, 420 and 430 are for non-continuous passband sub-filters 1, 2 and 3, respectively. That is, the solid line 410 is a plot of S21, the FP1 to FP2 separate transfer function for sub-filter 1 of the filter as a function of frequency and with resonance frequency SF1 in isolation. The dashed line 420 is a plot of S21, the FP1 to FP2 separate transfer function for sub-filter 2 of the filter as a function of frequency and with resonance frequency SF2 in isolation. The dotted line 430 is a plot of S21, the FP1 to FP2 separate transfer function for sub-filter 3 of the filter as a function of frequency and with resonance frequency SF3 in isolation. Since the exemplary filter is non-symmetrical, the solid, dashed and dotted lines 410, 420 and 430 are not plots of S12.

Figure 5:
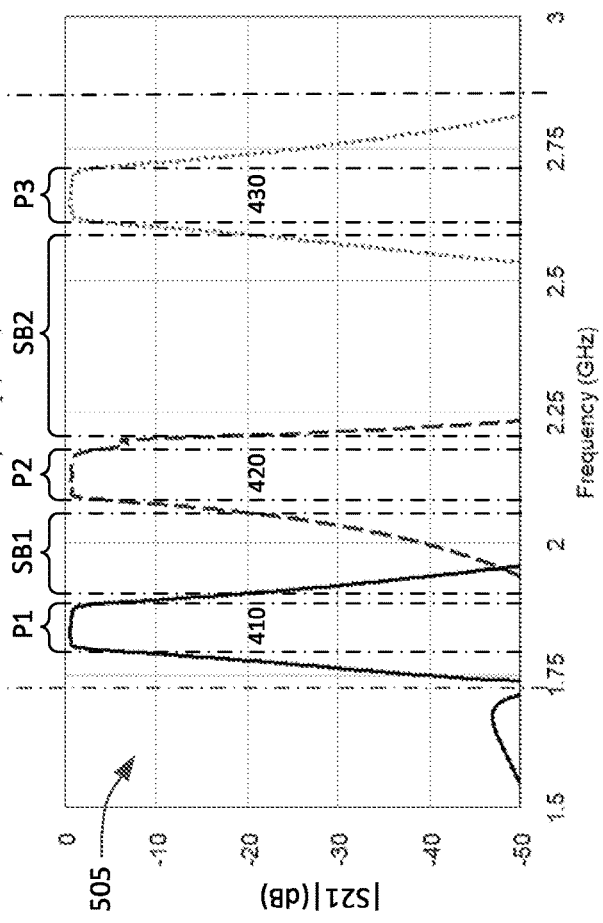
FIG. 5 is the graph of the performance of the embodiment of the filter of FIG. 3A showing passband frequencies of the sub-filters.

FIG. 5 is a graph 500 of the passband frequencies of the sub-filters within the exemplary matrix filter of the filter of FIG. 3A whose performance was shown in FIG. 4. The example of graph 500 may be for the receive frequencies of LTE bands 3, 1, and 7 (from low to high frequency) with pass bands defined as above −3 dB. Specifically, P1, P2, and P3 are passband frequencies above −3 dB of the magnitude of the input-output transfer functions for sub-filter 1, sub-filter 2, and sub-filter 3, respectively. Passbands P1, P2, and P3 are noncontiguous because each pair of adjacent passbands is separated by a stop band where the input-output transfer function of the matrix filter is less than −20 dB. For instance, passbands P1 and P2 are noncontiguous because that pair is separated by stop band SB1 that exist where the input-output transfer function S21 of the matrix filter 300 is less than −20 dB. Also, passbands P2 and P3 are noncontiguous because that pair is separated by stop band SB2 that exist where the input-output transfer function S21 of the matrix filter 300 is less than −20 dB.

The matrix filter for FIGS. 4 and 5 includes 3 sub-filters with connections between input and output ports that can be switched in and out to provide numerous passbands for input and output RF communication signals. Each sub-filter may include three XBARs, as shown in FIG. 3A and FIG. 3B. In other cases, there may be two, four, five or up to 10 sub-filters. Also, each sub-filter may include more than three XBARs and 2 coupling capacitors. Some sub-filters may have m acoustic resonators where m=four, five, six or up to 10; and a corresponding m−1 coupling capacitors as noted for FIG. 3B. In this example and all subsequent examples, filter performance was determined by simulating the filter using BVD models (FIG. 2A) for the XBARs. It can be appreciated that the concepts herein regarding 3 sub-filters can be expanded to only two or up to four, five or up to an arbitrary number determined by size and routing complexity considerations.

The input-output transfer function of the exemplary filter, as shown in FIG. 4, is the vector sum of the input-output transfer functions of the three sub-filters, where the three sub-filters have noncontiguous passbands. Noncontiguous passbands may mean that no single sub-filter input-output transfer function crosses another sub-filter input-output transfer function at a frequency where both filters S21 transfer functions are above −20 dB. To this end, the input-output transfer functions of sub-filter 1 and sub-filter 2 cross at a frequency just below 2 GHz where (a) S21 of both filters are not above −20 dB and (b) the phases of the input-output transfer functions of both filters are substantially equal. In this context, "not above" means sufficiently below to not cause objectionable variations in either of the transfer functions of a sub-filter due to the transfer function of a different sub-filter of the matrix filter within the filter passband ranges, which is this case is 1.5 to 3 GHz. The quantitative value of "not above" may be different for different filter applications. Similar requirements apply to sub-filter 2 and sub-filter 3. In matrix filters with more than three sub-filters, similar requirements apply to every adjacent (in frequency) pair of sub-filters.

In some cases, a "contiguous" passband matrix filter describes matrix filters having a passband that is the sum of the passbands of more than one sub-filter, while a "noncontiguous" passband matrix filter describes matrix filters where each passband is the passband of only one sub-filter. For some switched matrix filters, the passbands of the sub-filters of a "noncontiguous" are not adjacent or do not overlap above −20 dB. A matrix filter may also have some sub-filters that are contiguous and other sub-filters that are noncontiguous. For example, it may be a filter having at least one stop band between passbands of at least one pair of adjacent sub-filters.

In one example, the lowest passband, noncontiguous passband sub-filter 1, is LTE band Rx 3 and has 3 resonators and 2 coupling capacitors. Here, the middle passband, noncontiguous passband sub-filter 2, is LTE band Rx 1 and has 5 resonators and 4 coupling capacitors. The highest passband, noncontiguous passbands sub-filter 3, is LTE band Rx 7 and sub-filter has 4 resonators and 3 coupling capacitors. This filter may have one or more XL resonators and zero or more XH resonators.

The exemplary matrix filter is non-symmetrical in that the impedances at FP1 and FP2 are different. The impedance at port FP1 may be 50 ohms of a filter input port to be matched with the impedance of an RF antenna. The impedance at port FP2 may be 4 ohms of a filter output port to be matched to an output impedance of a power amplifier such as of an RF transmitter, such as when filter 300 is used as a transmit filter. In another case, the impedance at port FP2 may be 300 ohms of a filter output port to be matched to an input impedance of a low noise amplifier such as of an RF receiver, such as when filter 300 is used as a receive filter. The vertical dot-dash lines identify the resonance frequencies of the XBARs within the exemplary matrix filter. The line labeled "XL" identifies the resonance frequency of the resonators XL1 and XL2, which is adjacent to the lower edge of the filter passband. Similarly, the line labeled "XH" identifies the resonance frequency of the resonators XH1 and XH2, which is adjacent to the upper edge of the filter passband. The two lines labeled "SF1" in FIG. 4 identify the resonance frequencies of the XBARs within sub-filter 1 in isolation. The two lines labeled "PBF1" in FIG. 5 identify the passband frequencies of the XBARs within sub-filter 1 in isolation. Note that both of the resonance frequencies are lower than the center of the passband. This is because the resonance frequency of a resonator and a capacitor in series is higher that the resonance frequency of the resonator in isolation. Similarly, the two lines labeled "SF2" identify the resonance frequencies of the XBARs within sub-filter 2 and the two lines labeled "SF3" identify the resonance frequencies of the XBARs within sub-filter 3. Similarly, the two lines labeled "SF2" in FIG. 4 identify the resonance frequencies and two lines labeled "PBF2" in FIG. 5 identify the passband frequencies of the XBARs within sub-filter 2. Finally, the two lines labeled "SF3" in FIG. 4 identify the resonance frequencies and two lines labeled "PBF3" in FIG. 5 identify the passband frequencies of the XBARs within sub-filter 3.

Figure 6:
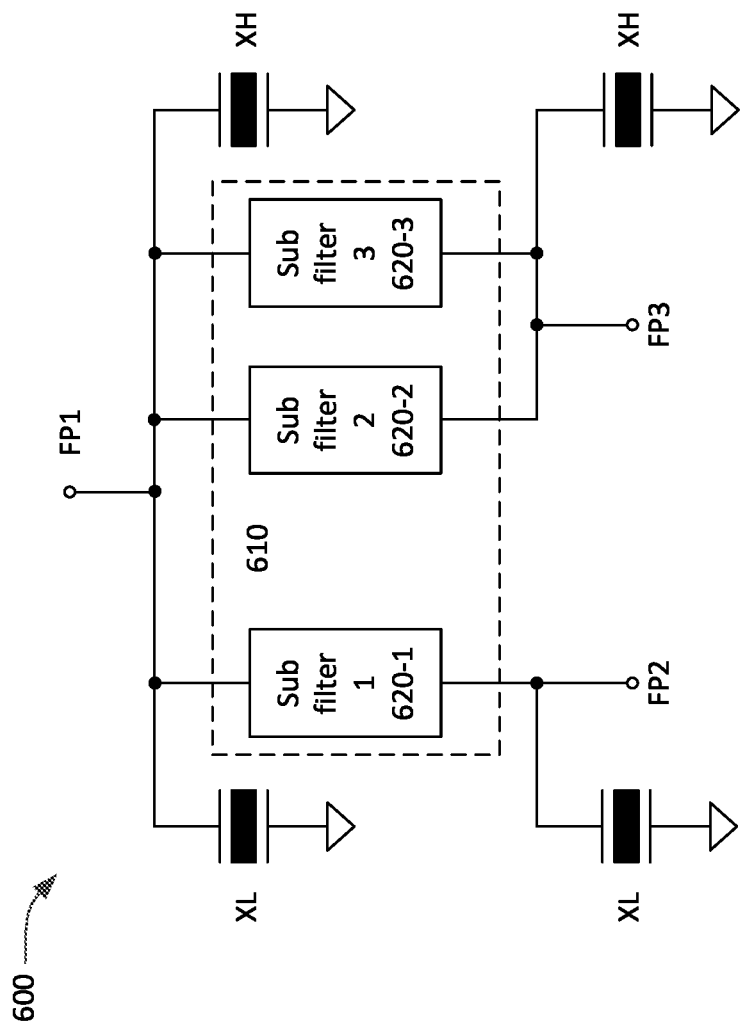
FIG. 6 is a schematic diagram of a matrix diplexer using acoustic resonators with input and output impedances matching to radio frequency front-end (RFFE) elements.

FIG. 6 is a schematic diagram of a matrix filter 600 configured as a diplexer with input and output impedances matching to radio frequency front-end (RFFE) elements. The matrix filter 600 includes an array 610 of three sub-filters 620-1, 620-2, 620-n. Sub-filter 1 620-1 is connected between a first filter port (FP1) and a second filter port (FP2). Sub-filter 2 620-2 and sub-filter 3 620-3 are connected in parallel between FP1 and a third filter port (FP3). FP1 is the common or input port of the diplexer and FP2 and FP3 are the branch or output ports. The array 610 of sub-filters is terminated at both ends by XBARs XL and XH as previously described.

Figure 7:
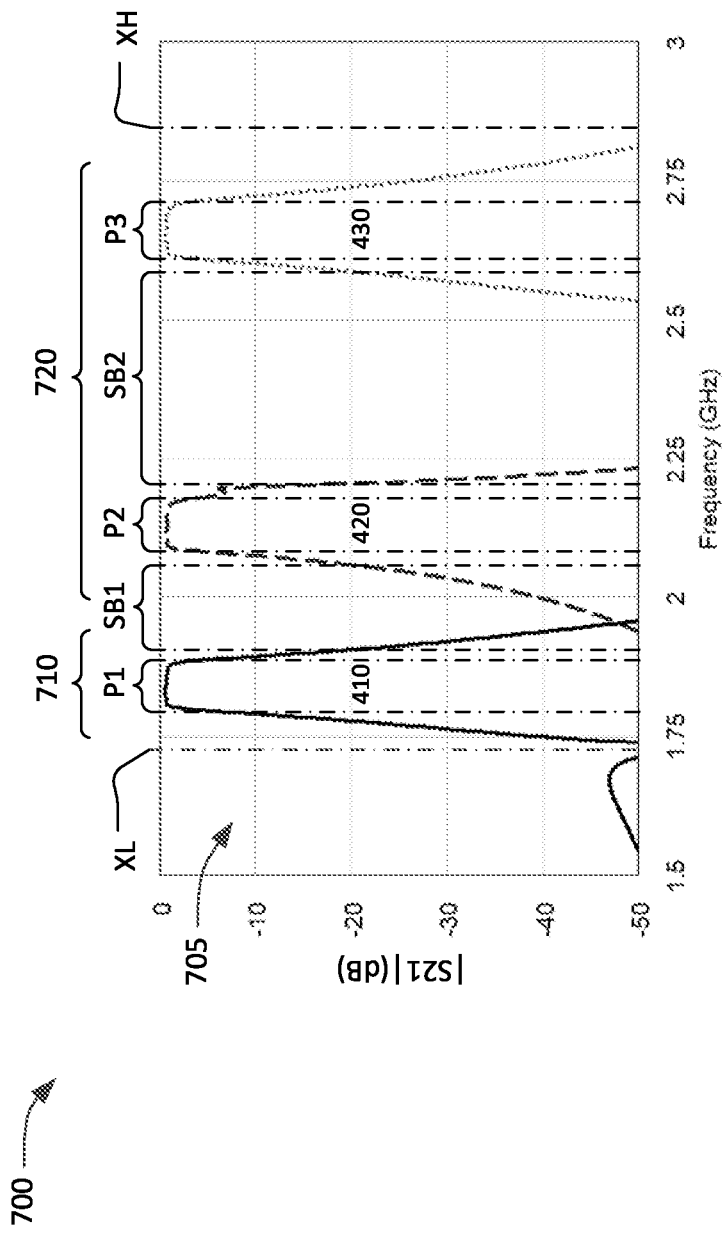
FIG. 7 is a graph of input-output transfer functions of an embodiment of the switched diplexer of FIG. 6.

FIG. 7 is a graph 700 of the performance 705 of an example of the matrix filter diplexer 600 of FIG. 6. In this example, XL, XH, and the three sub-filters are the same as the corresponding elements of the matrix filter 300 of FIG. 3A. In FIG. 7, the solid line 410 under 710 is a plot of S21, the FP1 to FP2 transfer function, as a function of frequency. The dashed line 420 and dotted line 430 under 720 is a plot of S31, the FP1 to FP3 transfer function, as a function of frequency. Since the exemplary filter is non-symmetrical, the solid line 410 under 710 and the dashed line 420 and dotted line 430 under 720 are not plots of S12 and S13, respectively. The switched matrix filter 600 is exemplary. In most applications, a diplexer will have the same number (two, three or more) sub-filters in parallel between the common or input port and the two branch ports.

FP1 may be considered the common or input port of the matrix filter diplexer 600. FP2 may be considered the "low band" port and FP3 may be considered the "high band" port. When the matrix filter diplexer is used in a frequency division duplex radio, one of FP2 and FP3 may be the receive or output port of the diplexer and the other of FP2 and FP3 may be the transmit or output port of the diplexer depending on the frequencies allocated for reception and transmission.

In a second diplexer configuration that is a variant of filter 600, sub-filter 1 620-1 and sub-filter 2 620-2 are connected in parallel between FP1 and a FP2. Here, sub-filter 3 620-3 is connected between a FP1 and a FP3. In this case, a graph of the performance of an example of the matrix filter diplexer has the solid line 410 and dashed line 420 as a plot of S21; and the dotted line 430 as a plot of S31, as a function of frequency.

In a third diplexer configuration that is a variant of filter 600, sub-filter 1 620-1 and sub-filter 3 620-3 are connected in parallel between FP1 and FP2. Here, sub-filter 2 620-2 is connected between FP1 and FP3. In this case, a graph of the performance of an example of the switched matrix filter diplexer has the solid line 410 and dotted line 430 as a plot of S21; and the dashed line 420 as a plot of S31, as a function of frequency.

The diplexer filter 600 and two variants are switched matrix filters because any one of the branch ports FP2 or FP3 may be selected or switched to as an output for the filter. For example, the sub-filters connections between input and output ports can be switched in and out to provide numerous passbands for input and output RF communication signals. A processor (not shown) may be coupled to and may control the operation of switches within the filter 600, such as to provide the branch port selections.

In any of the configurations of diplexer filter 600, the impedance at port FP1 may be 50 ohms of a filter input port to be matched with the impedance of an RF antenna. The impedance at each of port FP2 and FP3 may be 4 ohms of a filter output port to be matched to an output impedance of a power amplifier such as of an RF transmitter; or it may be 300 ohms of a filter output port to be matched to an input impedance of a low noise amplifier such as of an RF receiver. In some cases, the impedance at port FP2 is the same as at FP3. In other cases, they are different.

Figure 8:
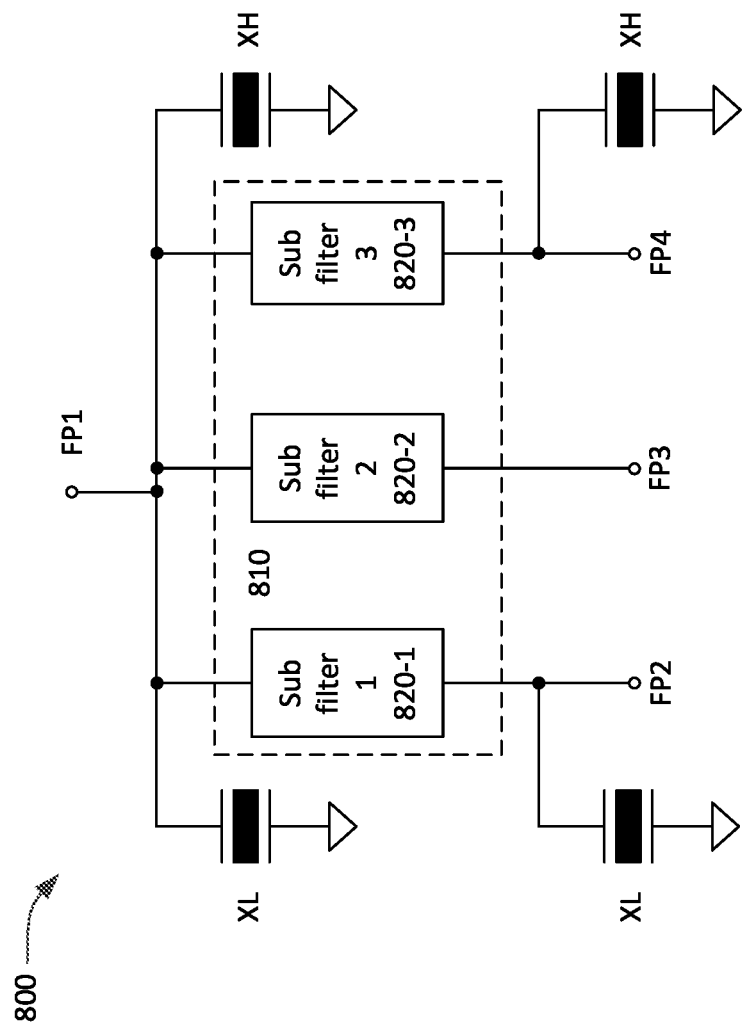
FIG. 8 is a schematic diagram of a matrix triplexer using acoustic resonators with input and output impedances matching to radio frequency front-end (RFFE) elements.

FIG. 8 is a schematic diagram of a matrix triplexer filter 800 using acoustic resonators with input and output impedances matching to radio frequency front-end (RFFE) elements. The matrix filter 800 includes an array 810 of three sub-filters 820-1, 820-2, 820-n. Sub-filter 1 820-1 is connected between a first filter port (FP1) and a second filter port (FP2). Sub-filter 2 820-2 is connected between FP1 and a third filter port (FP3). Sub-filter 3 820-3 is connected between FP1 and a fourth filter port (FP4). The array 810 of sub-filters is terminated at both ends by XBARs XL and XH as previously described. FP1 is the common or input port of the multiplexer and FP2, FP3, and FP4 are branch or output ports of the multiplexer. A multiplexer may have more than three branch ports. A multiplexer with two branch ports is commonly referred to as a "diplexer" and a multiplexer with three branch ports may be referred to as a "triplexer".

Figure 9:
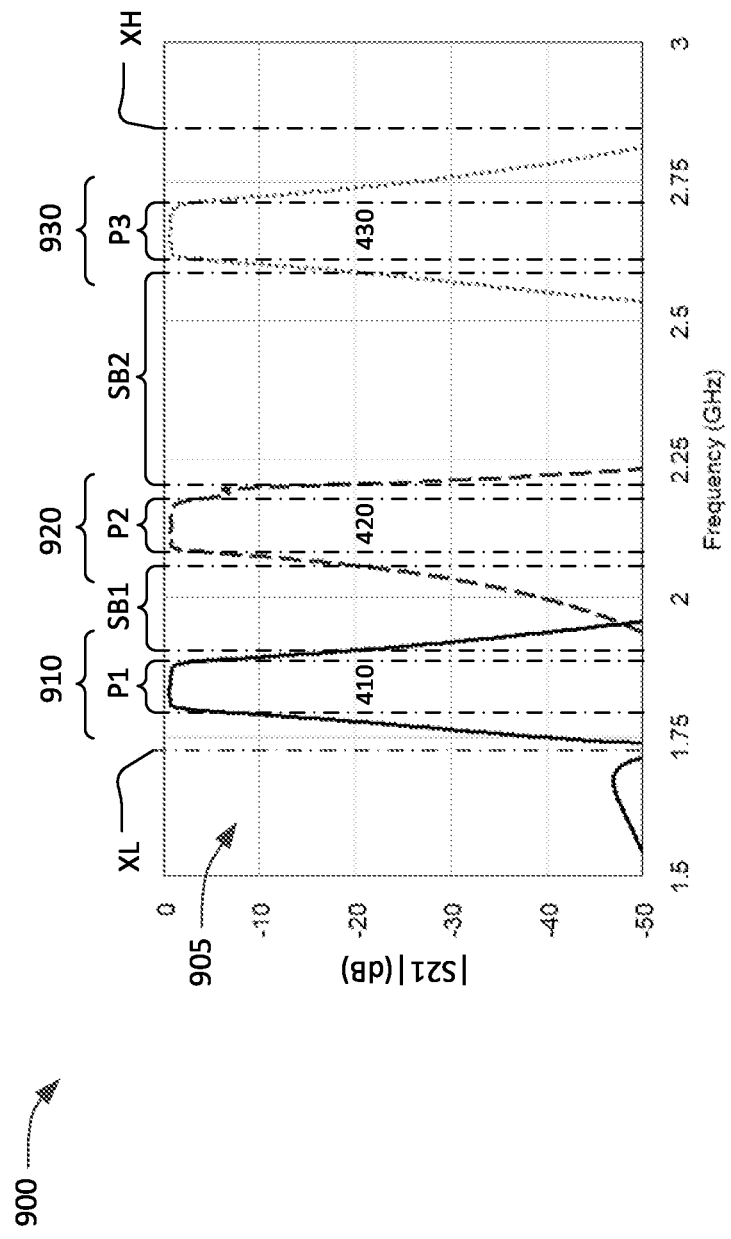
FIG. 9 is a graph of input-output transfer functions of an embodiment of the triplexer of FIG. 8.

FIG. 9 is a graph 900 of the performance of an example of the functions of an embodiment of the triplexer filter 800 of FIG. 8. In this example, XL, XH, and the three sub-filters are the same as the corresponding elements of the matrix filter 300 of FIG. 3A. In FIG. 9, the solid line under 910 is a plot of S21, the FP1 to FP2 transfer function, as a function of frequency. The dashed line under 920 is a plot of S31, the FP1 to FP3 transfer function, as a function of frequency. The dotted line under 930 is a plot of S41, the FP1 to FP4 transfer function, as a function of frequency. Since the exemplary filter is non-symmetrical, the solid line under 910, the dashed line under 920, and the dotted line under 930 are not plots of S12, S13 and S14, respectively.

FP1 may be considered the common or input port of the matrix filter. FP2 may be considered the "low band" port, FP3 may be considered the "middle band" port and FP4 may be considered the "high band" port. When the matrix filter is used in a frequency division duplex (FDD) radio, one of FP2, FP3 and FP4 may be the receive or output port and another of FP2, FP3 and FP4 may be the transmit or output port depending on the frequencies allocated for reception and transmission. In other cases, in a FDD radio, two of FP2, FP3 and FP4 may be the receive or output port and the other of FP2, FP3 and FP4 may be the transmit or output port; or vice versa.

In additional multiplexer configurations that are variants of filter 800, any one or more of sub-filter 1 820-1, sub-filter 2 820-2, and sub-filter 3 820-3 may be connected in parallel between FP1 and FP2, FP3 and/or FP4. In this case, a graph of the performance of an example of the matrix filter diplexer has the corresponding ones of the solid, dashed and dotted lines 410, 420 and/or 430 as a plot of S21, S31 and/or S41, as a function of frequency.

The multiplexer filter 800 and two variants may be switched matrix filters because any one or more of the ports FP2, FP3 and FP4 may be selected or switched to as an output for the filter. For example, the sub-filters connections between input and output ports can be switched in and out to provide numerous passbands for input and output RF communication signals. In one example, a switched XBAR matrix filter having 3 sub-filters for LTE bands 3, 1, and 7 provides a multi-passband reconfigurable filter that is configurable for all 7 possible states: only 1, only 3, only 7, 1+3, 1+7, 3+7, and 1+3+7. This filter has low loss due to its matrix architecture, such as due to the location of the switches and due to the filter not needing inductors. A processor (not shown) may be coupled to and may control the operation of switches within the filter 800, such as to select the sub-filters and ports FP2, FP3 and FP4.

In any of the configurations of triplexer filter 800, the impedance at port FP1 may be 50 ohms of a filter input port to be matched with the impedance of an RF antenna. The impedance at each of port FP2, FP3 and FP4 may be 4 ohms of a filter output port to be matched to an output impedance of a power amplifier such as of an RF transmitter; or it may be 300 ohms of a filter output port to be matched to an input impedance of a low noise amplifier such as of an RF receiver. In some cases, the impedance at all of the ports FP2, FP3 and FP4 is the same. In other cases, the impedance at one of those 3 ports is different than that at the other two.

FIG. 10A is a schematic diagram of a reconfigurable switched matrix filter 1000 using XBARs with input and output impedances matching to radio frequency front-end (RFFE) elements. The reconfigurable switched matrix filter 1000 includes an array 1010 of n sub-filter/switch circuits 1020-1, 1020-2, 1020-*n* connected in parallel between a first filter port (FP1) and a second filter port (FP2), where n is an integer greater than one. In a subsequent example, n=3. In other cases, n can be greater than 3 as necessary to provide the desired bandwidth for the reconfigurable matrix filter 1000. Each sub-filter/switch circuit functions as a noncontiguous bandpass filter that can be selectively enabled (i.e. connected between FP1 and FP2) or disabled (i.e. not connected between FP1 and FP2). The array 1010 of sub-filter/switch circuits is terminated at both ends by XBARs XL and XH as previously described.

The sub-filter/switch circuits 1020-1, 1020-2, 1020-*n* have noncontiguous passbands such that the bandwidth of the matrix filter 1000, when all sub-filter/switch modules are enabled, is not equal to the sum of the bandwidths of the constituent sub-filters, but instead has three separate and independent passbands separated by stop bands that exist where the input-output transfer function of the matrix filter 300 is less than −20 dB. One or more of the sub-filter/switch circuits can be disabled to tailor the matrix filter bandwidth or to insert notches or stop bands within the overall passband, such as to provide the desired noncontiguous passbands for the matrix filter. The filter 1000 and/or sub-filters may be RF filters that pass frequency bands defined by the 5G NR standard.

FIG. 10B is a schematic diagram of a sub-filter/switch circuit 1050 suitable for sub-filter/switch circuits 1020-1, 1020-2, and 1020-*n* in FIG. 10A. The sub-filter/switch circuit 1050 includes three acoustic resonators X1, X2, X3 in series between a first sub-filter port (SP1) and a second sub-filter port (SP2), and coupling capacitors C1, C2 connected from the junctions between adjacent acoustic resonators to ground. The inclusion of three acoustic resonators in the sub-filter/switch circuit 1050 is exemplary, and a sub-filter/switch circuit may have more than three acoustic resonators. When a sub-filter/switch circuit includes more than three acoustic resonators, the number of coupling capacitors will be one less than the number of acoustic resonators. The acoustic resonators X1, X2, X3 are preferably but not necessarily XBARs.

The sub-filter/switch circuit 1050 includes a switch SW in series with acoustic resonator X2. When the switch SW is closed, the sub-filter/switch circuit operates as a sub-filter suitable for use in any of the prior examples. In this case, the sub-filter/switch circuit connection between input and output ports is switched in to provide the passband of that sub-filter for input and output RF communication signals. When the switch SW is open, the sub-filter/switch circuit presents the proper impedance to SP1 and SP2 but has the input-output transfer function of an open circuit. In this case, the sub-filter/switch circuit connection between input and output ports is switched out and does not provide the passband of that sub-filter for input and output RF communication signals. When a sub-filter/switch circuit includes more than three acoustic resonators, the switch may be in series with any of the acoustic resonators other than the two acoustic resonators connected to the two sub-filter ports. In other words, the switch can be in series with any of the "middle acoustic resonators" in the middle of the string of resonators, but not the two "end acoustic resonators" at the ends of the string. In some cases, filter 1000 may be described has having respective output ports SP2 of all of its sub-filters connected to a common output port FP2.

Figure 10C:
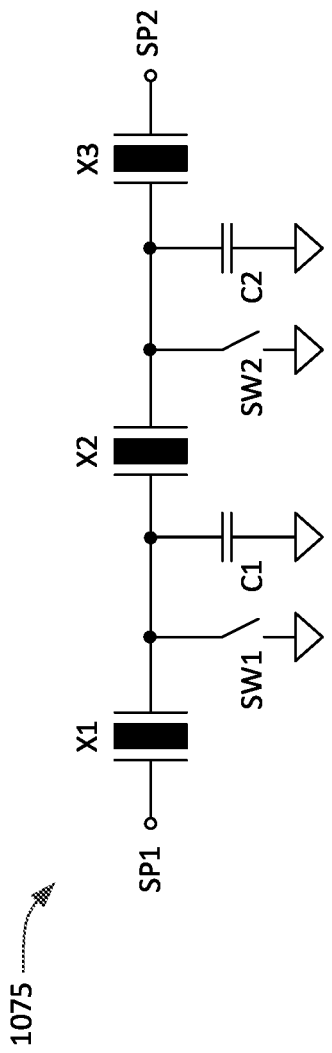
FIG. 10C is a schematic diagram of another type of sub-filter and switch module of FIG. 10A.

FIG. 10C is a schematic diagram of a sub-filter/switch circuit 1075 suitable for sub-filter/switch circuits 1020-1, 1020-2, and 1020-*n* in FIG. 10A. The sub-filter/switch circuit 1075 includes three acoustic resonators X1, X2, X3 in series between a first sub-filter port (SP1) and a second sub-filter port (SP2), and coupling capacitors C1, C2 connected from the junctions between adjacent acoustic resonators to ground. The inclusion of three acoustic resonators in the sub-filter/switch circuit 1075 is exemplary, and a sub-filter/switch circuit may have more than three acoustic resonators. When a sub-filter/switch circuit includes more than three acoustic resonators, the number of coupling capacitors will be one less than the number of acoustic resonators. The acoustic resonators X1, X2, X3 are preferably but not necessarily XBARs.

The sub-filter/switch circuit 1075 includes a switch SW1 in parallel with the first shunt capacitor C1 and a switch SW2 in parallel with the last shunt capacitor C2. When the switches SW1 and SW2 are open, the sub-filter/switch circuit operates as a sub-filter suitable for use in any of the prior examples. In this case, the sub-filter/switch circuit connection between input and output ports is switched in to provide the passband of that sub-filter for input and output RF communication signals. When the switches SW1 and SW2 are closed, the sub-filter/switch circuit presents the proper impedance to SP1 and SP2 but has the input-output transfer function of an open circuit. In this case, the sub-filter/switch circuit connection between input and output ports is switched out and does not provide the passband of that sub-filter for input and output RF communication signals. Switches SW1 and SW2 may be used in place of switch SW of FIG. 10B to switch certain sub-filters in and out between input and output ports.

When a sub-filter/switch circuit includes more than two shunt capacitors, the switches are in parallel with the two shunt capacitors immediately adjacent to the acoustic resonators connected to the two sub-filter ports. In other words, the switches are in parallel with the "first shunt capacitor" and the "last shunt capacitor" that are not in the middle of the string of resonators, but are just inside of the two "end acoustic resonators" at the ends of the string. For example, the first switch is in parallel with the first capacitor shunt element that is between an XBAR series element that is immediately adjacent to the filter input port and an XBAR series element that is farther from the input port; and the second switch is in parallel wherein the last capacitor shunt element that is between an XBAR series element that is immediately adjacent to the filter output port and an XBAR series element that is farther from the output port.

Figure 11:
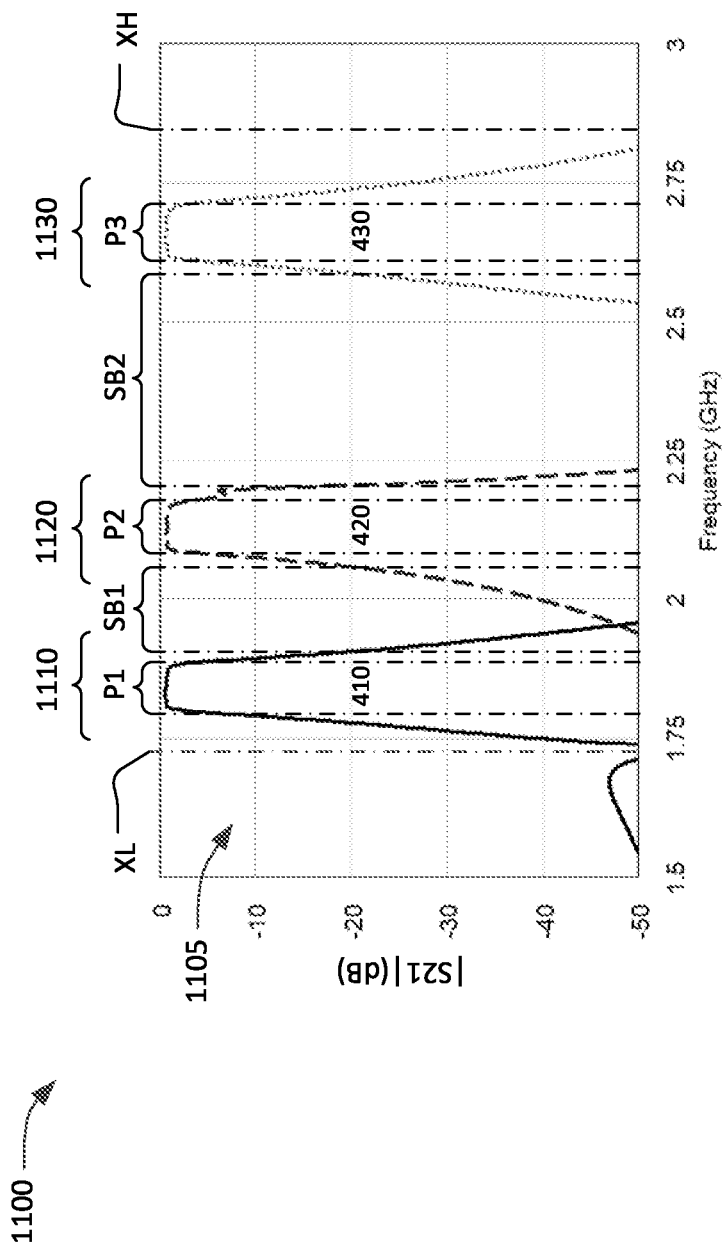
FIG. 11 is a graph of input-output transfer functions of two configurations of an embodiment of the reconfigurable switched matrix filter of FIG. 10A.

FIG. 11 is a graph 1100 of the performance 1105 of an example of the reconfigurable switched matrix filter 1000 of FIG. 10. In this example, XL, XH, and the components within the three sub-filter/switch circuits are the same as the corresponding elements of the matrix filter 300 of FIG. 3A. In FIG. 11, the solid line under 1110 is a plot of S21, the port 1 to port 2 transfer function, of the filter as a function of frequency when sub-filter/switch circuit 1 is enabled and sub-filter/switch circuit 2 and 3 are disabled. The dashed line under 1120 is a plot of S21 as a function of frequency when sub-filter/switch circuit 2 is enabled and sub-filter/switch circuit 1 and 3 are disabled. The dashed line under 1130 is a plot of S21 as a function of frequency when sub-filter/switch circuit 3 is enabled and sub-filter/switch circuit 1 and 2 are disabled. The sum of the two curves under 1110 and 1130, not shown but easily envisioned, is the port 1 to port 2 transfer function as a function of frequency when sub-filter/switch circuits 1 and 3 are enabled and sub-filter/switch circuit 2 is disabled. The sum of the two curves under 1110 and 1120, is the port 1 to port 2 transfer function as a function of frequency when sub-filter/switch circuits 1 and 2 are enabled and sub-filter/switch circuit 3 is disabled. The sum of the two curves under 1110 and 1130, is the port 1 to port 2 transfer function as a function of frequency when sub-filter/switch circuits 1 and 3 are enabled and sub-filter/switch circuit 2 is disabled. The sum of the two curves under 1120 and 1130, is the port 1 to port 2 transfer function as a function of frequency when sub-filter/switch circuits 2 and 3 are enabled and sub-filter/switch circuit 1 is disabled. The sum of the three curves under 1110, 1120 and 1130, is the port 1 to port 2 transfer function as a function of frequency when sub-filter/switch circuits 1, 2 and 3 are enabled. The input-output transfer function of an open circuit is the port 1 to port 2 transfer function as a function of frequency when all of the sub-filter/switch circuits 1, 2 and 3 are disabled. A total of eight different filter configurations are possible by enabling various combinations of the three sub-filter/switch circuits. A processor (not shown) may be coupled to and may control the operation of switches within the filters 1000, 1050 and/or 1075, such as to select the sub-filters.

In any of the configurations of filters 1000, 1050 and/or 1075, the impedance at port FP1 may be 50 ohms of a filter input port to be matched with the impedance of an RF antenna. The impedance at port FP2 may be 4 ohms of a filter output port to be matched to an output impedance of a power amplifier such as of an RF transmitter; or it may be 300 ohms of a filter output port to be matched to an input impedance of a low noise amplifier such as of an RF receiver.

The sub-filter/switch circuit connections between input and output ports of filters 1000, 1050 and/or 1075 can be switched to select the desired passband and the desired impedance at port FP2. For example, switches SW of FIG. 10B can be used to select one of sub-filters 1050 of filter 1000 having a desired passband for a transmitted signal from a transmitter and a desired impedance to match the output impedance of a power amplifier of the transmitter. Also, switch SW of FIG. 10B can be used to select one of sub-filters 1050 of filter 1000 having a desired passband for a received signal from the antenna to be sent to a receiver and a desired impedance to match the input impedance of a low noise amplifier of the receiver. Also, switches SW1 and SW2 of FIG. 10C can be used to select one of sub-filters 1075 of filter 1000 having a desired passband and a desired impedance as noted for switch SW.

Figure 12:
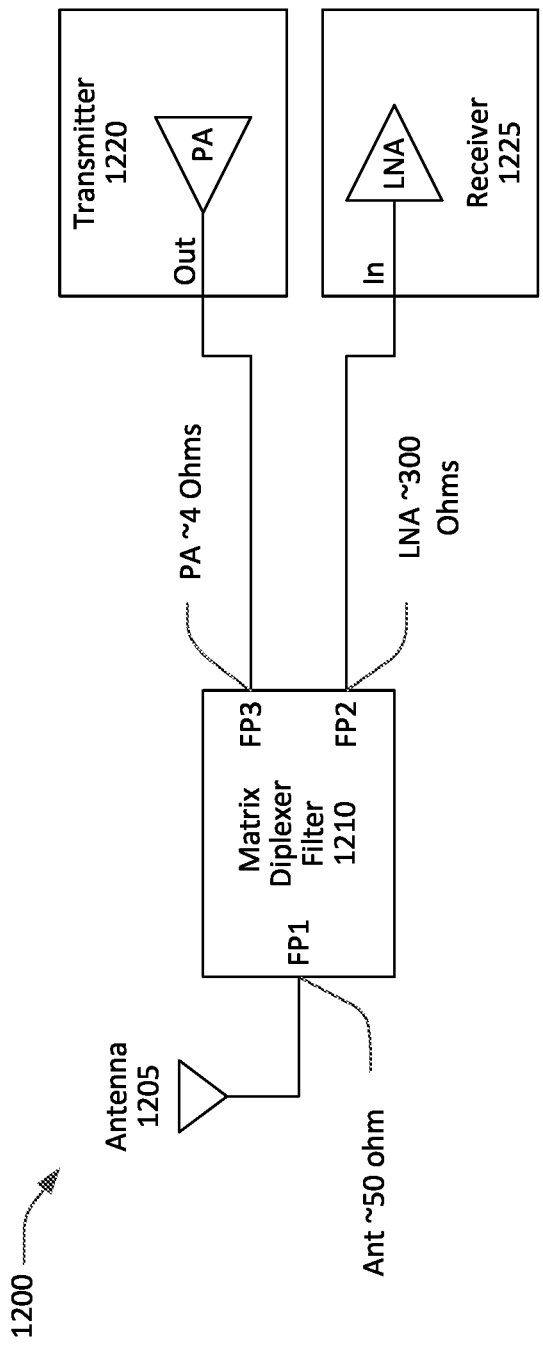
FIG. 12 is a schematic block diagram of a frequency division duplex (FDD) radio with input and output impedances matching to radio frequency front-end (RFFE) elements.

FIG. 12 is a schematic block diagram of a frequency division duplex (FDD) radio 1200 with input and output impedances matching to radio frequency front-end (RFFE) elements. An FDD radio transmits and receives in different frequency ranges with a defined communications band. The transmit and receive frequency ranges are typically, but not necessarily, adjacent. The radio 1200 includes an antenna 1205, a matrix filter diplexer 1210 having a common filter port FP1 configured to connect to an antenna 1205, a transmit filter port FP3 coupled to the output port Out of a transmitter 1220, and a receive filter port FP2 coupled to the input port In of a receiver 1225.

The radio 1200 is configured for operation in the designated communications band. The matrix filter diplexer 1210 includes a receive filter coupled between FP1 and FP2 and a transmit filter coupled between FP1 and FP3. The receive filter may include one or more receive sub-filters. The transmit filter may include one or more transmit sub-filters. The transmit filter must be compatible with the RF power generated by the transmitter 1220. The matrix filter diplexer 1210 may be implemented using acoustic resonators which may be XBARs.

The matrix filter diplexer 1210 may be similar to two of the matrix filter 300 of FIG. 3A-B. Here, each of filter 300 is a transmit or a receive filter with an equal number of sub-filters switched in for each of the transmit or receive filters. Here, the common filter port FP1 of the matrix filter diplexer 1210 is FP1 of the filters 300; transmit port FP3 of the matrix filter diplexer 1210 is port FP2 of a transmit filter version of filter 300; and receive port FP2 of the matrix filter diplexer 1210 is port FP2 of a receive filter version of filter 300. The two filters 300 may have different passbands. In this case, port FP1 may be common to the two filters 300.

The matrix filter diplexer 1210 may be similar to the matrix diplexer 600 of FIG. 6 with an equal number of sub-filters in the transmit and receive filters. Here, the common filter port FP1 of the matrix filter diplexer 1210 is FP1 of the matrix diplexer 600; the transmit or output port FP3 may be either of FP2 or FP3 of the matrix diplexer 600; and the receive or output port FP2 may be the other of FP2 and FP3 of the matrix diplexer 600.

In another case, the matrix filter diplexer 1210 may be similar to the matrix triplexer filter 800 of FIG. 8 with an equal number of sub-filters in the transmit and receive filters. Here, the common filter port FP1 of the matrix filter diplexer 1210 is FP1 of the matrix triplexer 800; the transmit or output port FP3 may be any of FP2, FP3 or FP4 of the matrix triplexer 800; and the receive or output port FP2 may be any of the other of FP2, FP3 or FP4 of the matrix triplexer 800.

Also, the matrix filter diplexer 1210 may be similar to two of the matrix filter 1000 of FIG. 10A-C. Here, each of filter 1000 is a transmit or a receive filter with an equal number of sub-filters switched in for each of the transmit or receive filters. Here, the common filter port FP1 of the matrix filter diplexer 1210 is FP1 of each of the matrix filters 1000; transmit port FP3 of the matrix filter diplexer 1210 is port FP2 of a transmit filter version of filter 1000 based on switching in and out of the sub-filters of the matrix filter 1000; and receive port FP2 of the matrix filter diplexer 1210 is port FP2 of a receive filter version of filter 1000 based on switching in and out of the sub-filters of the matrix filter 1000. In this case, port FP1 may be common to the two filters 1000.

It is also considered that matrix filter diplexer 1210 may be similar to a combination of two of filters 300, 600, 800 and 1000 with an equal number of sub-filters switched in for each of the transmit or receive filters. Here, port FP1 of the matrix filter diplexer 1210 is a common port; transmit port FP3 of the matrix filter diplexer 1210 is a transmit port; and receive port FP2 of the matrix filter diplexer 1210 is a receive port of one of filters 300, 600, 800 and 1000. In this case, port FP1 may be common to the combination of filters.

In any of the configurations of filter 1210, the impedance at port FP1 is 50 ohms to match the impedance of RF antenna 1205. The impedance at port FP3 is matched to an output impedance of power amplifier (PA) of an RF transmitter 1220. For example, the impedance at port FP3 may be about 4 ohms. The impedance at port FP2 is matched to an input impedance of a low noise amplifier (LNA) of an RF receiver 1225. The impedance at port FP2 may be an impedance that minimizes the noise figure of the LNA. The impedance may be, for example, about 300 ohms.

Figure 13:
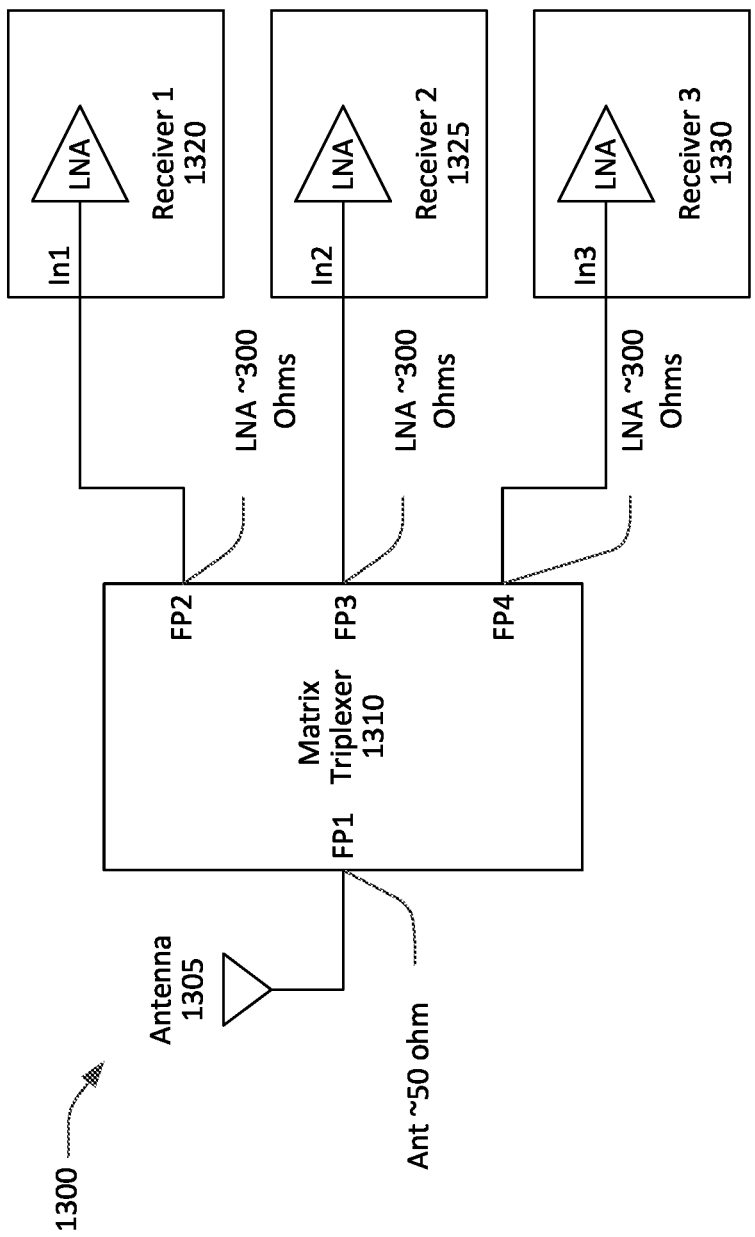
FIG. 13 is a block diagram of a three-band diversity receiver using a matrix triplexer with input and output impedances matching to radio frequency front-end (RFFE) elements.

FIG. 13 is a schematic block diagram of a three-band diversity receiver 1300 using a matrix triplexer with input and output impedances matching to radio frequency front-end (RFFE) elements. A three-band diversity receiver radio receives in three different frequency ranges corresponding to three communications band. The receiver 1300 includes an antenna 1305, a matrix filter triplexer 1310 having a common filter port FP1 configured to connect to an antenna 1305, a first output or receive filter port FP2 coupled to the input port In1 of a receiver 1320, a second output or receive filter port FP3 coupled to the input port In2 of a receiver 1325, and a third output or receive filter port FP4 coupled to the input port In3 of a receiver 1330.

The receiver 1300 is configured for operation in the designated communications band. The matrix filter triplexer 1310 includes a receive filter coupled between each of: FP1 and FP2; FP1 and FP3; and FP1 and F4. The receive filter includes noncontiguous passband receive sub-filters. The matrix filter triplexer 1310 may be implemented using acoustic resonators which may be XBARs.

The matrix filter triplexer 1310 may be similar to three of the matrix filter 300 of FIG. 3A-B. Here, each of filter 300 is a receive filter with an equal number of sub-filters switched in for each of the receive filters. Here, the common filter port FP1 of the matrix filter diplexer 1210 is FP1 of each of the filters 300; and the FP2, FP3 and FP4 ports of the matrix filter triplexer 1310 may be FP2 of each of three receive filter version of filter 300. The three filters 300 may have different passbands. In this case, port FP1 may be common to the three filters 300.

The matrix filter triplexer 1310 may be the matrix triplexer 800 of FIG. 8. The FP1, FP2, FP3 and FP4 ports of the matrix filter triplexer 1310 may be the FP1, FP2, FP3 and FP4 ports of the matrix multiplexer 800.

In another case, the matrix filter triplexer 1310 may be similar to three of the reconfigurable switched filter 1000 of FIG. 10A-C, each with an equal number of sub-filters in the three receive filters. The FP1 port of the matrix filter triplexer 1310 may be FP1 of the three reconfigurable switched filters 1000; and the FP2, FP3 and FP4 ports of the matrix filter triplexer 1310 may be FP2 of each of the three reconfigurable switched filter 1000 where the three filters 1000 may have different passbands based on switching in and out of the sub-filters of the three matrix filters 1000. In this case, port FP1 may be common to the three filters 1000.

It is also considered that matrix filter triplexer 1310 may be similar to a combination of any three of filters 600, 800 and 1000 with an equal number of sub-filters switched in for each of the receive filters. Here, port FP1 of the matrix filter triplexer 1310 is a common port; and each of ports FP2, FP3 and/or FP4 of the matrix filter triplexer 1310 is a receive port of one of filters 600, 800 and 1000. In this case, port FP1 may be common to the combination of filters.

In any of the configurations of filter 1310, the impedance at port FP1 is 50 ohms of a filter input port that is matched with the impedance of RF antenna 1305. The impedance at port FP2, FP3 and FP4 are each matched to an input impedance of a low noise amplifier (LNA) of each of RF receivers 1320, 1325 and 1330, respectively. The impedance at each port FP2, FP3, FP4 may be an impedance that minimizes the noise figure of the respective LNA. The impedance at each port may be, for example, about 300 ohms. The impedances at the three ports may be different to accommodate the characteristics of the LNAs of RF receivers 1320, 1325 and 1330.

Figure 14:
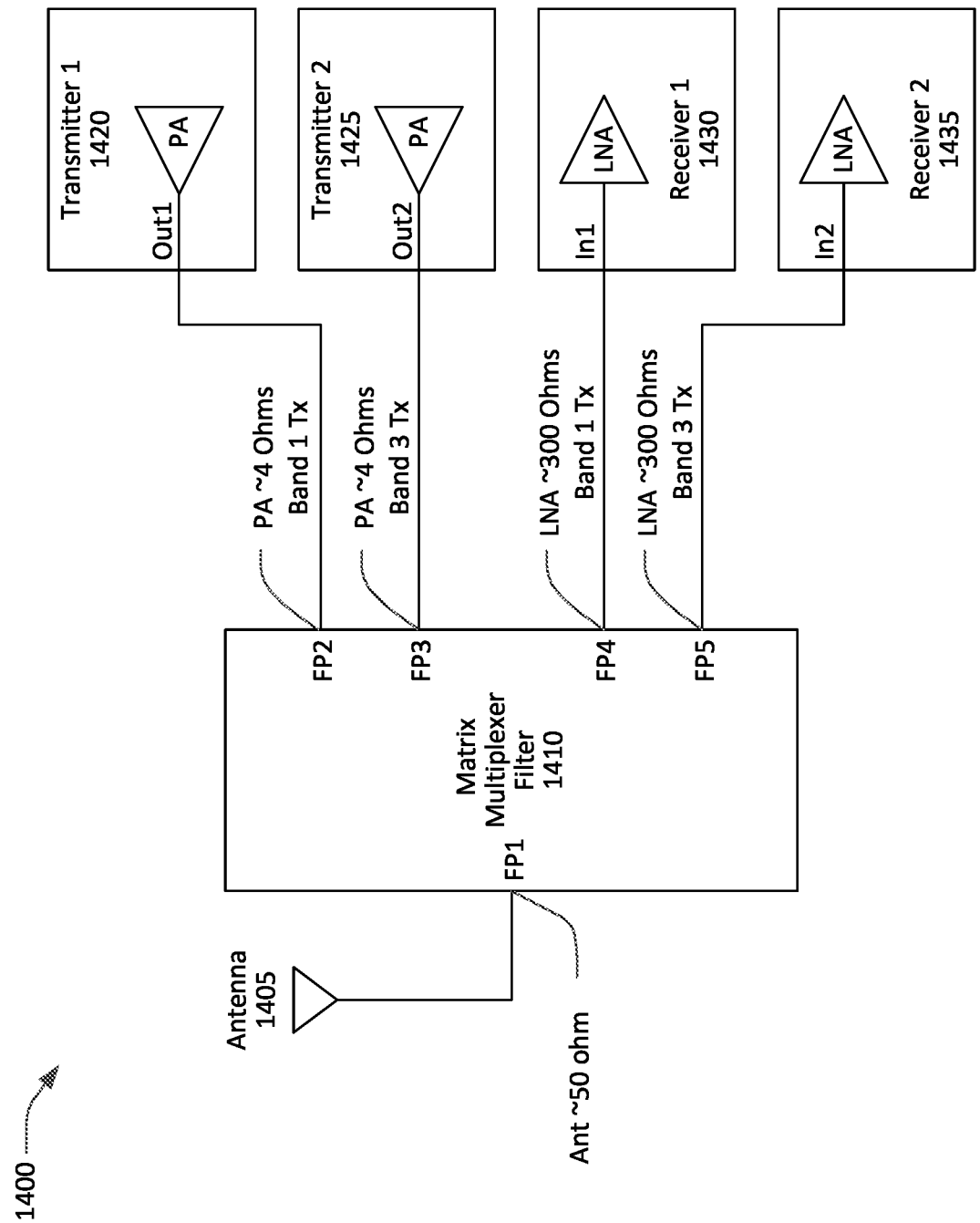
FIG. 14 is a block diagram of a dual-band frequency division radio using a matrix multiplexer filter with input and output impedances matching to radio frequency front-end (RFFE) elements.

FIG. 14 is a schematic block diagram of a dual-band frequency division radio using a matrix multiplexer filter with input and output impedances matching to radio frequency front-end (RFFE) elements. Radio 1400 transmits and receives in different frequency ranges with a defined communications band. The transmit and receive frequency ranges are typically, but not necessarily, adjacent. The radio 1400 includes an antenna 1405, a matrix filter multiplexer 1410 having a common filter port FP1 configured to connect to an antenna 1405; transmit filter ports FP2 and FP3 coupled to the output ports Out1 and Out2 of transmitters 1420 and 1425, respectively; and receive filter ports FP4 and FP5 coupled to the input ports In1 and In2 of receivers 1430 and 1435 respectively.

The radio 1400 is configured for operation in the designated communications band. The matrix filter multiplexer 1410 includes a first transmit filter coupled between FP1 and FP2; a second transmit filter coupled between FP1 and FP3; a first receive filter coupled between FP1 and FP4; and a second receive filter coupled between FP1 and FP5. The transmit filters may include one or more transmit sub-filters. The receive filters may include one or more receive sub-filters. The transmit filters are compatible with the RF power generated by the transmitters 1420 and 1425. The matrix filter multiplexer 1410 may be implemented using acoustic resonators which may be XBARs.

The matrix filter multiplexer 1410 may be similar to four of the matrix filter 300 of FIG. 3A-B. Here, each of filter 300 is a transmit or a receive filter with an equal number of sub-filters switched in for each of the transmit or receive filters. Here, the common filter port FP1 of the matrix filter multiplexer 1410 is FP1 of the filters 300; transmit ports FP2 and FP3 of the matrix filter diplexer 1210 is port FP2 of a transmit filter version of filter 300; and receive ports FP4 and FP5 of the matrix filter diplexer 1210 is port FP2 of a receive filter version of filter 300. Pairs of the transmit and receive filters 300 may have different passbands. In this case, port FP1 may be common to the four filters 300.

The matrix filter multiplexer 1410 may be similar to two of the matrix diplexers 600 of FIG. 6 with an equal number of sub-filters in the transmit and receive filters. Here, the common filter port FP1 of the matrix filter multiplexer 1410 is FP1 of the two matrix diplexers 600; the transmit or output ports FP2 and FP3 may be either of FP2 or FP3 of the two matrix diplexers 600; and the receive or output ports FP4 and FP5 may be the other of FP2 and FP3 of the two matrix diplexers 600. Pairs of the transmit and receive filters of filters 600 may have different passbands. In this case, port FP1 may be common to the four filters 600.

In another case, the matrix filter multiplexer 1410 may be similar to the matrix triplexer filter 800 of FIG. 8 with 4 sub-filters (e.g., a quadplexer) instead of three as the transmit and receive filters. This filter adds a sub-filter 4 (not shown) similar to the other sub-filters but connected to input port FP1 and having output port FP5. Here, the common filter port FP1 of the matrix filter diplexer 1210 is FP1 of the matrix triplexer 800; the transmit or output ports FP2 and FP3 of the matrix filter diplexer 1210 may be any two of FP2, FP3, FP4 or FP5 of the matrix triplexer 800; and the receive or output ports FP4 and FP5 may be the other two of FP2, FP3, FP4 or FP5 of the matrix triplexer 800. Pairs of the transmit and receive filters of filters 600 may have different passbands.

Also, the matrix filter multiplexer 1410 may be similar to four of the matrix filter 1000 of FIG. 10A-C. Here, each of filter 1000 is a transmit or a receive filter with an equal number of sub-filters switched in for each of the transmit or receive filters. Here, the common filter port FP1 of the matrix filter diplexer 1210 is FP1 of each of the filters 1000; transmit ports FP2 and FP3 of the matrix filter multiplexer 1410 is port FP2 of a transmit filter version of filter 1000 based on switching in and out of the sub-filters of the matrix filter 1000; and receive ports FP4 and FP5 of the matrix filter multiplexer 1210 is port FP2 of a receive filter version of filter 1000 based on switching in and out of the sub-filters of the matrix filter 1000. Pairs of the transmit and receive filters of filters 1000 may have different passbands. In this case, port FP1 may be common to the four filters 1000.

It is also considered that matrix filter multiplexer 1410 may be similar to a combination of two or four of filters 300, 600, 800 and 1000 with an equal number of sub-filters switched in for each of the transmit or receive filters. Here, port FP1 of the matrix filter multiplexer 1410 is a common port; transmit ports FP2 and FP3 of the matrix filter multiplexer 1410 are each a transmit port of a transmit filter; and receive ports FP4 and FP5 of the matrix filter multiplexer 1410 are each a receive port of a receive filter of one of filters 300, 600, 800 and 1000. In this case, port FP1 may be common to the combination of filters.

In any of the configurations of filter 1410, the impedance at port FP1 is 50 ohms of a filter input port that is matched with the impedance of RF antenna 1405. The impedance at each of ports FP2 and FP3 is matched to an output impedance of power amplifiers (PA) of RF transmitters 1420 and 1425, respectively. The impedance at each of ports FP4 and FP5 is matched to an input impedance of low noise amplifier (LNA) of RF receivers 1430 and 1435, respectively.

The four transmit and receive filters of multiplexer 1410 may transmit and receive on various frequency bands. For example, each of the four transmit and receive filters within the matrix multiplexer filter 1410 will use a separate bandpass. In the example of FIG. 14, the transmit filter between FP1 and FP2, and the receive filter between FP1 and FP4 may pass the uplink and downlink frequencies for LTE band 1; while the transmit filter between FP1 and FP3, and the receive filter between FP1 and FP5 pass the uplink and downlink frequencies for LTE band 3. Specifically, the transmit filter between FP1 and FP2 passes frequencies for LTE Band 1 Tx of 1900-1980 MHz; the receive filter between FP1 and FP4 passes frequencies for LTE Band 1 Rx is 2110-2170; the transmit filter between FP1 and FP3 passes frequencies for LTE Band 3 Tx of 1710-1785 MHz; the receive filter between FP1 and FP5 passes frequencies for LTE Band 1 Rx is 1805-1880.

Figure 15A:
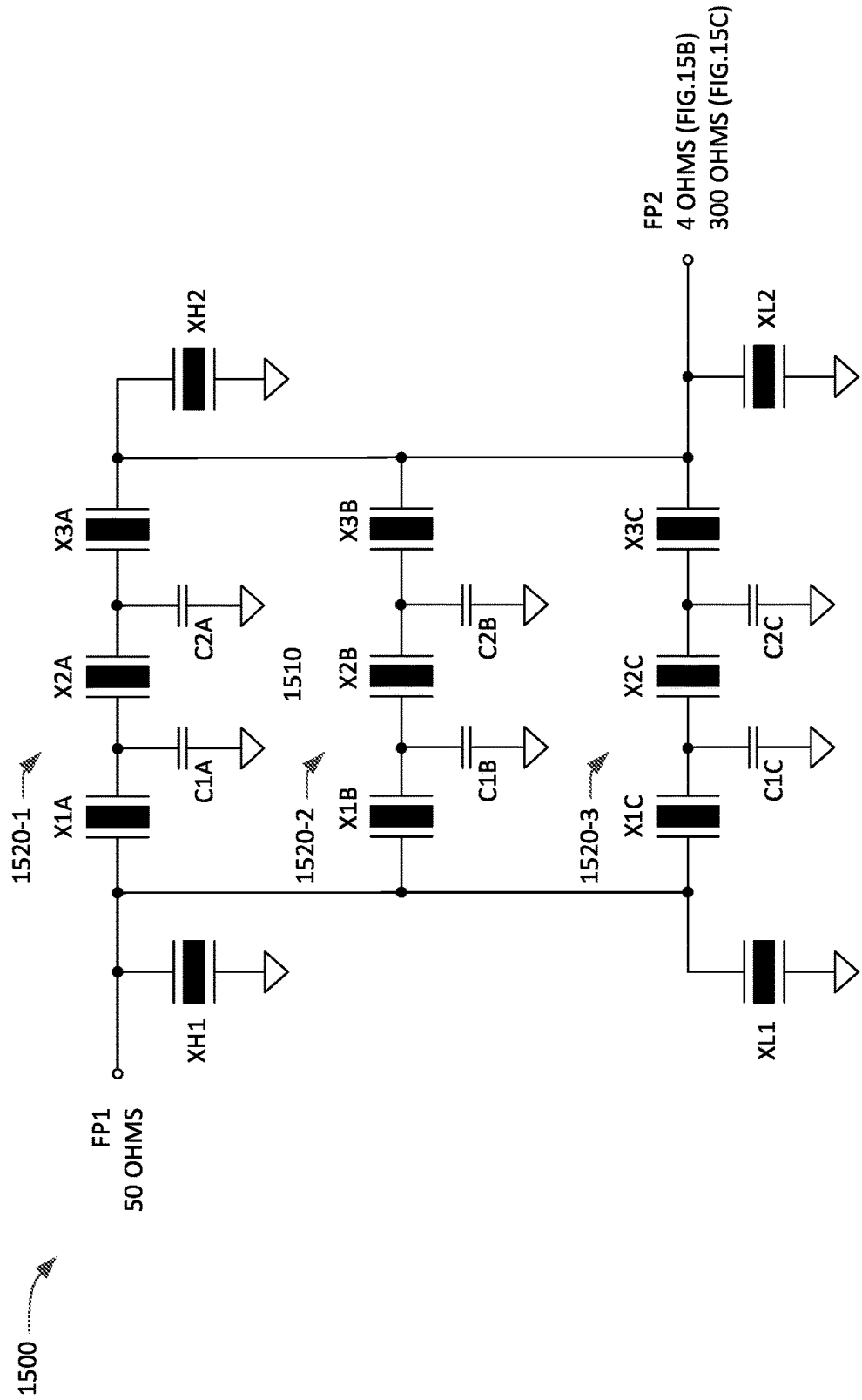
FIG. 15A is a schematic diagram of a matrix filter using acoustic resonators with input and output impedances matching to radio frequency front-end (RFFE) elements.

FIG. 15A is a schematic diagram of a matrix filter 1500 using acoustic resonators with input and output impedances matching to radio frequency front-end (RFFE) elements. FIGS. 15A is a specific example of FIGS. 3A-B. The matrix filter 1500 includes an array 1510 of 3 sub-filters 1520-1, 1520-2, and 1520-3 connected in parallel between an input filter port (FP1) and an output filter port (FP2). The sub-filters 1520-1, 1520-2, and 1520-3 have noncontiguous passbands such that the bandwidth of the matrix filter 1500 is not equal to the sum of the bandwidths of the constituent sub-filters, but instead has three separate and independent passbands separated by stop bands that exist where the input-output transfer function of the matrix filter 1500 is less than −20 dB.

The filter 1500 and/or each of sub-filters 1520-1, 1520-2, and 1520-3 may be RF filters that pass frequency bands defined by the 5G NR standard. The array 1510 of sub-filters is terminated at the input or FP1 end and at the output or FP2 end by acoustic resonators that create "transmission zeros" as noted for filter 300.

Each of the sub-filters 1520-1, 1520-2, and 1520-3 includes three acoustic resonators XA, XB, XC connected in series between FP1 and FP1. The acoustic resonators XA, XB, XC are preferably but not necessarily XBARs. Each sub-filter includes two coupling capacitors CA, CB, each of which is connected between ground and a respective node between two of the acoustic resonators. The acoustic resonators XL1 and XL2 of filter 1500 also act as shunt inductances to help match the impedance at the ports of the filter to a desired impedance value.

Filter 1500 has an input port FP1 impedance of 50 ohms and an output port FP2 impedance of either 4 ohms or 300 ohms. The impedance at FP1 may be matched to 50 ohms when connected to an RF antenna. The impedance at FP2 may be matched to 4 ohms when connected to a power amplifier such as of an RF transmitter, and to 300 ohms when connected to a low noise amplifier such as of an RF receiver. The description of FP1 as an input port and FP2 as an output port may be reversed, such as when FP2 is connected to a low noise amplifier or RF receiver. The sub-filters 1520-1, 1520-2, and 1520-3 may each pass various frequency bands as noted herein. In some cases, each may use a separate bandpass as noted for any of FIGS. 4-5, 7, 9 and 11-14.

FIG. 15B shows specific component characteristics for a first example of FIG. 15A with an input port FP1 impedance of 50 ohms and an output port FP2 impedance of 4 ohms. In this case, FP1 may be matched to 50 ohms when connected to an RF antenna, and the impedance at FP2 may be matched to 4 ohms when connected to a power amplifier such as of an RF transmitter. The characteristic of FIG. 15B shown the largest capacitances (resonator "X" C0 values and coupling capacitor "C" C0 values) are near the 4 ohm port FP2 than that of those near FP1. For example, capacitances of the X3 resonators are greater than for the X1 or X2 resonators. Also, capacitances of the C2 capacitors are greater than that of the C1 capacitors. Finally, capacitance of the H2 and L2 resonators are greater than that of the H1 and L1 resonators. The passbands for the FIG. 15B example of filter 1500 could be any of the various pass band frequencies as noted herein for FP1 matched to 50 ohms and FP2 matched to 4 ohms.

FIG. 15C shows specific component characteristics for a second example of FIG. 15A with an input port FP2 impedance of 300 ohms and an output port FP1 impedance of 50 ohms. In this case, FP1 may be matched to 50 ohms when connected to an RF antenna, and the impedance at FP2 may be matched to 300 ohms when connected to a low noise amplifier such as of an RF receiver. The characteristic of FIG. 15B shown the largest capacitances (resonator "X" C0 values and coupling capacitor "C" C0 values) are near the 50 ohm port FP1 than that of those near FP2. For example, capacitances of the X1 resonators are greater than for the X2 or X3 resonators. Also, capacitances of the C1 capacitors are greater than that of the C2 capacitors. Finally, capacitance of the H1 and L1 resonators are greater than that of the H2 and L2 resonators. The passbands for the FIG. 15C example of filter 1500 could be any of the various pass band frequencies as noted herein for FP1 matched to 50 ohms and FP2 matched to 300 ohms.

For certain embodiments herein, port FP1 may be described as a common or filter input port of a transmit or receive filter between an input and an output port of the matrix filters herein. Port FP2, FP3, FP4 or FP5 may be described as a transmit or filter output port of a transmit filter between an input and an output port of the matrix filters herein when the impedance of this port is matched to an output impedance of a power amplifier such as of an RF transmitter. Port FP2, FP3, FP4 or FP5 may be described as a receive or filter output port of a transmit filter between an input and an output port of the matrix filters herein when the impedance of this port is matched to an input impedance of a low noise amplifier such as of an RF receiver.

In some embodiments, descriptions of impedance values herein, such as of 50 ohms, 4 ohms and 300 ohms may vary substantially to meet the requirements of the RFFE. Although the descriptions herein include that impedances can be 50 ohms that is matched with the impedance of RF antenna, 300 ohms that is matched to an input impedance of a low noise amplifier (LNA), and 4 ohms that is matched to an output impedance of a power amplifier (PA), it can be appreciated that various other impedances may be used for matching with the antenna, LNA and/or PA.

A key benefit of the matrix filters herein is the capability of setting the input and/or output impedance of the filters over a wide range to provide matching to radio frequency front-end (RFFE) elements such as antenna (Ant), power amplifiers (PAs) and low noise amplifiers (LNs). By matching impedances with the RFFE' s the matrix filters herein have input and output impedances that minimizes the noise figure from Ant, of receiver LNAs and from transmitter PAs. Because the matrix filter has impedance matching the RFFEs, there is no need for external impedance matching or switching. Moreover, the acoustic resonator matrix filter topologies herein, such as of filter 300, 600, 800 and/or 1000; radio 1200 and/or 1400; and receiver 1300 may reduce the size of resonators in the filters, thus: lowering the cost of components for and of manufacturing of the filters; provide filters having achievable impedance transformation for matching impedance at the input and output of the filter; and provide filters that are matched to the minimum noise figure of output connected LNAs without any matching inductor.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A matrix filter diplexer, comprising:
    a receive matrix filter coupled between a receive port and an antenna port; and
    a transmit matrix filter coupled between the antenna port and a transmit port, wherein:
        an impedance at the receive port is matched to an input impedance of a low noise amplifier (LNA),
        an impedance at the transmit port is matched to an output impedance of a power amplifier (PA), and
        an impedance at the antenna port is matched to an impedance of an antenna, and
    wherein the receive and the transmit matrix filters each include two or more sub-filters the each comprise a ladder circuit with a plurality of transversely-excited film bulk acoustic resonator (XBAR) series elements and a plurality of capacitor shunt elements that are each connected between ground and a node between a respective pair of XBAR series elements.

2. The matrix filter diplexer of claim 1, wherein the impedance at the receive port is 300 ohms of a filter output port that is matched to an input impedance of low noise amplifier (LNA) of an RF receiver,
    the impedance at the transmit port is 4 ohms of a filter output port that is matched to an output impedance of a power amplifier (PA) of an RF transmitter, and
    the impedance at the antenna port is 50 ohms of a filter input port that is matched with the impedance of a radio frequency (RF) antenna.

3. The matrix filter diplexer of claim 1, wherein:
    the two or more sub-filters of each of the respective matrix filters are connected between the filter antenna port and respective filter output ports, and
    the ladder circuit of each sub-filter comprises n transversely-excited film bulk acoustic resonator (XBAR) series elements and n−1 capacitor shunt elements, where n is an integer greater than 2.

4. The matrix filter diplexer of claim 1 wherein the two or more sub-filters have noncontiguous passbands, and wherein each of the noncontiguous passbands is the passband of only one sub-filter.

5. The matrix filter diplexer of claim 1, wherein each of the two or more sub-filters have noncontiguous passbands separated by a stop band that exists where the input-output transfer function of the matrix filter is less than −20 dB.

6. The matrix filter diplexer of claim 1, wherein the XBAR series elements include a first end XBAR connected to a first sub-filter port, a second end XBAR connected to a second sub-filter port, and one or more middle XBARs connected between the first and second end XBARs.

7. The matrix filter diplexer of claim 1 wherein a radio frequency signal applied to the transmit port or the antenna port excites a primary shear acoustic mode in the XBAR series elements.

8. A matrix filter multiplexer, comprising:
first and second receive matrix filters coupled between first and second receive ports and an antenna port; and
first and second transmit matrix filters coupled between the antenna port and first and second transmit ports,
wherein:
an impedance at the first and second receive ports is matched to an input impedance of a low noise amplifier,
an impedance at the first and second transmit ports is matched to an output impedance of a power amplifier, and
an impedance at the antenna port is matched to an impedance of an antenna, and
wherein the first and second receive matrix filters and the first and second transmit matrix filters each include two or more sub-filters the each comprise a ladder circuit with a plurality of transversely-excited film bulk acoustic resonator (XBAR) series elements and a plurality of capacitor shunt elements that are each connected between ground and a node between a respective pair of XBAR series elements.

9. The matrix filter multiplexer of claim 8, wherein
the impedance at the first and second receive port is 300 ohms of a filter output port that is matched to an input impedance of low noise amplifiers (LNAs) of first and second RF receivers,
the impedance at the first and second transmit port is 4 ohms of a filter output port that is matched to an output impedance of power amplifiers (PAs) of first and second RF transmitters, and
the impedance at the antenna port is 50 ohms of a filter input port that is matched with the impedance of a radio frequency (RF) antenna.

10. The matrix filter multiplexer of claim 8, wherein :
the two or more sub-filters of each of the respective matrix filters are connected between the filter antenna port and respective filter output ports, and
the ladder circuit of each sub-filter comprises n transversely-excited film bulk acoustic resonator (XBAR) series elements and n−1 capacitor shunt elements, where n is an integer greater than 2.

11. The matrix filter multiplexer of claim 9 wherein the two or more sub-filters have noncontiguous passbands, and wherein each of the noncontiguous passbands is the passband of only one sub-filter.

12. The matrix filter multiplexer of claim 9, wherein each of the two or more sub-filters have noncontiguous passbands separated by a stop band that exists where the input-output transfer function of the matrix filter is less than −20 dB.

13. The matrix filter multiplexer of claim 9, wherein the XBAR series elements include a first end XBAR connected to a first sub-filter port, a second end XBAR connected to a second sub-filter port, and one or more middle XBARs connected between the first and second end XBARs.

14. The matrix filter multiplexer of claim 9 wherein a radio frequency signal applied to one of the first transmit port, the second transmit port or the antenna port excites a primary shear acoustic mode in the XBAR series elements.

15. A matrix filter, comprising:
a filter input port; and
two or more sub-filters connected between the filter input port and respective filter output ports, each sub-filter comprising a ladder circuit with n transversely-excited film bulk acoustic resonator (XBAR) series elements and n−1 capacitor shunt elements, where n, the order of the sub-filter, is an integer greater than 2, and wherein
an impedance at a first plurality of the respective filter output ports is matched to an input impedance of a low noise amplifier,
an impedance at a second plurality of the respective filter output ports is matched to an output impedance of a power amplifier, and
an impedance at the input port is matched to an impedance of an antenna.

16. The filter of claim 15, wherein the two or more sub-filters have noncontiguous passbands, and wherein each of the noncontiguous passbands is the passband of only one sub-filter.

17. The filter of claim 15, wherein each of the two or more sub-filters have noncontiguous passbands separated by a stop band that exists where the input-output transfer function of the matrix filter is less than −20 dB.

18. The filter of claim 15, wherein only one of the two or more sub- filters is connected between the filter input port and respective filter output ports and wherein no input-output transfer function of a single sub-filter crosses an input-output transfer function of another sub-filter at a frequency where the respective input-output transfer functions are above −20 dB.

19. The filter of claim 15, wherein connections of the respective sub-filters between the filter input and the respective filter output ports is configured to be switched to select one or more of the noncontiguous passbands.

20. A three-band diversity receiver, comprising:
a matrix triplexer coupled between and antenna and three receivers, the triplexer comprising:
a first sub-filter coupled between a first filter port and a second filter port coupled to the first receiver;
a second sub-filter coupled between the first filter port and a third filter port coupled to the second receiver;
a third sub-filter coupled between the first filter port and a fourth filter port coupled to the third receiver;
wherein each sub-filter comprises a ladder circuit with at least three transversely-excited film bulk acoustic resonator (XBAR) series elements and at least two capacitor shunt elements, and
wherein an impedance of the second, third and fourth filter ports is matched to an input impedance of a respective low noise amplifier, and an impedance at the first filter port is matched to an impedance of an antenna.

21. The filter of claim 20, wherein each of the first, second and third sub-filters has a noncontiguous passband separated from the passband of all of the other first, second and third sub-filters by a stop band that exists where an input-output transfer function of the matrix filter is less than −20 dB.

22. The filter of claim 20, wherein
each of the XBAR series elements is connected in series between the first sub-filter port and the second sub-filter port; and
each of the shunt capacitors is connected between ground and a node between a respective pair of XBAR series elements.

* * * * *